United States Patent
Kokubu et al.

(10) Patent No.: US 7,993,038 B2
(45) Date of Patent: Aug. 9, 2011

(54) LIGHT-EMITTING DEVICE

(75) Inventors: Hideki Kokubu, Aichi-ken (JP);
Toshimasa Hayashi, Aichi-ken (JP);
Kenichi Koya, Kagoshima (JP); Michio Miyawaki, Kagoshima (JP)

(73) Assignees: Toyoda Gosei Co., Ltd., Nishikasugai-gun, Aichi-ken (JP);
Panasonic Corporation, Osaka (JP)

( * ) Notice: Subject to any disclaimer, the term of this patent is extended or adjusted under 35 U.S.C. 154(b) by 28 days.

(21) Appl. No.: 12/073,466

(22) Filed: Mar. 5, 2008

(65) Prior Publication Data

US 2008/0225532 A1  Sep. 18, 2008

(30) Foreign Application Priority Data

Mar. 6, 2007 (JP) .............................. P.2007-054981
Mar. 6, 2007 (JP) .............................. P.2007-054982
Mar. 6, 2007 (JP) .............................. P.2007-054983

(51) Int. Cl.
*F21V 15/00* (2006.01)

(52) U.S. Cl. ......... 362/368; 362/362; 174/521; 257/692

(58) Field of Classification Search .................... 257/99, 257/79, 731, 668, 684, E23.06, E33.043, 257/E33.056, E33.072, 81, 98, 100, 666, 257/672, 676, 678, 692, 696; 438/106, 116; 362/800, 227, 246, 249.02, 311.02, 355, 362/362, 612; 313/46, 113, 498, 500, 512; 174/520, 521

See application file for complete search history.

(56) References Cited

U.S. PATENT DOCUMENTS

| | | | | |
|---|---|---|---|---|
| 5,803,573 A | * | 9/1998 | Osawa et al. | 362/612 |
| 6,486,543 B1 | * | 11/2002 | Sano et al. | 257/684 |
| 6,610,563 B1 | * | 8/2003 | Waitl et al. | 438/166 |
| 7,282,785 B2 | * | 10/2007 | Yoshida | 257/666 |
| 7,365,407 B2 | * | 4/2008 | Ng et al. | 257/433 |
| 7,385,227 B2 | * | 6/2008 | Mok et al. | 257/98 |

(Continued)

FOREIGN PATENT DOCUMENTS

CN  1848469 A  10/2006

(Continued)

OTHER PUBLICATIONS

Chinese Office Action dated Feb. 27, 2009 with English-Language Translation.

*Primary Examiner* — Hargobind S Sawhney
(74) *Attorney, Agent, or Firm* — McGinn IP Law Group PLLC

(57) ABSTRACT

In a light-emitting device including a base body portion which is configured by integrally forming a reflection case and a terminal holding portion provided at the rear portion of the reflection case and lead members to be inserted into the base body portion, portions of the lead members extracted outside of the base body portion are bent along the terminal holding portion to form a pair of connection portions to be connected to the pattern of a wiring board, respectively, a plurality of radiation plates are provided at the lead member. The plurality of radiation plates are extracted from the same surface (lower surface) of the base body portion. Since the plurality of radiation plates are provided, at the time of being the radiation plates, the base body portion is prevented from being applied with an excessive force and the damage of the base body portion can be prevented.

18 Claims, 28 Drawing Sheets

U.S. PATENT DOCUMENTS

| | | | |
|---|---|---|---|
| 7,393,122 B2* | 7/2008 | Tsuzuki et al. | 362/304 |
| 7,476,913 B2* | 1/2009 | Isobe et al. | 257/98 |
| 7,566,159 B2 | 7/2009 | Oon et al. | |
| 7,615,799 B2 | 11/2009 | Su | |
| 7,635,915 B2* | 12/2009 | Xie et al. | 257/692 |
| 7,800,304 B2* | 9/2010 | Norfidathul et al. | 313/512 |
| 2002/0089047 A1* | 7/2002 | Arndt | 257/678 |
| 2002/0163001 A1* | 11/2002 | Shaddock | 257/79 |
| 2005/0253158 A1* | 11/2005 | Yasukawa et al. | 257/98 |
| 2005/0269592 A1* | 12/2005 | Lee et al. | 257/100 |
| 2005/0277216 A1* | 12/2005 | Asakawa | 438/22 |
| 2006/0146563 A1* | 7/2006 | Chen | 362/561 |
| 2006/0170083 A1* | 8/2006 | Kim et al. | 257/666 |
| 2006/0226435 A1* | 10/2006 | Mok et al. | 257/98 |
| 2007/0183159 A1* | 8/2007 | Maeta et al. | 362/362 |
| 2007/0187709 A1* | 8/2007 | Yamamoto | 257/99 |
| 2008/0041625 A1* | 2/2008 | Cheong et al. | 174/521 |

FOREIGN PATENT DOCUMENTS

| | | |
|---|---|---|
| JP | 2000-183407 | 6/2000 |
| JP | 2002-520823 | 7/2002 |
| JP | 2002-280616 | 9/2002 |
| JP | 2006-19313 | 1/2006 |
| JP | 2006-253551 | 9/2006 |
| JP | 2007-12727 | 1/2007 |
| WO | WO 00/02262 | 1/2000 |

* cited by examiner

LIGHT-EMITTING DEVICE

BACKGROUND OF THE INVENTION

1. Field of the Invention

The present invention relates to a light-emitting device of a side surface light emission type that is surface mounted on a wiring board.

2. Description of the Related Art

A patent document 1 discloses an example the light-emitting device of the aforesaid type. This light-emitting device is configured in a manner that lead members are extracted outside from the both side portions of a reflection case which front side is opened and has a planer bottom portion, a terminal holding portion is integrally provided at the rear portion of the reflection case, portions of the lead member extracted from the reflection case are bent from the side portions of the reflection case along the terminal holding portion and further bent along the lower surface of the terminal holding portion, and the tip ends of the portions of the lead members are housed within notched portions as connection portions, respectively.

According to the light-emitting device of a side surface light emission type thus configured, since the lead members extracted from the reflection case are bent and housed within the notched portions of the terminal holding portion, the lead members do not protrude from the reflection case. Thus, the durability of the lead members can be improved.

A patent document 2 and a patent document 3 should be referred as documents relating to the invention.

Patent Document 1: JP-A-2006-253551
Patent Document 2: JP-A-2006-19313
Patent Document 3: JP-A-2002-280616

In recent years, the light-emitting devices have been required to have a larger output value. Thus, the light-emitting device tends to mount an LED chip having a large output value thereon. The LED chip having a large output value generates a large amount of heat. When the temperature of the LED chip itself increases, the output value thereof reduces undesirably. Thus, it is necessary to efficiently radiate heat from the LED chip.

SUMMARY OF THE INVENTION

The invention is made in order to attain the aforesaid object and is configured in the following manner.

A light-emitting device of a side surface light emission type to be surface mounted on a wiring board, includes:

a base body portion which is configured by integrally forming a reflection case and a terminal holding portion provided at a rear portion of the reflection case; and a lead member to be inserted into the base body portion, wherein portions of the lead member extracted from the base body portion are bent along the terminal holding portion to form a pair of connection portions to be connected to a pattern on the wiring board, respectively, an outwardly extracted portion is provided at the lead member, and the outwardly extracted portion is extracted from a surface of the base body portion different from the surface of the base body portion where the connection portions are extracted and bent along a lower surface of the terminal holding portion.

According to the light-emitting device thus configured, the outwardly extracted portion is provided at the lead member and the outwardly extracted portion is disposed along the lower surface of the terminal holding portion. Since the lower surface of the terminal holding portion serves as a mounting surface on the wiring board in the light-emitting device of a side surface light emission type, the outwardly extracted portion is made in contact with the wiring board. Since the outwardly extracted portion is integrated with the lead member, when the outwardly extracted portion is made in contact with the wiring board, the radiation efficiency of heat generated from an LED chip mounted on the lead member can be improved. That is, the outwardly extracted portion acts as radiation plates.

The second aspect of the invention is defined as follows.

That is, in the light-emitting device according to the first aspect, plural of the outwardly extracted portion are provided at the lead member.

According to the invention of the second aspect, since a plurality of the outwardly extracted portions are provided, as compared with a case where a single outwardly extracted portion having the same area as those of the outwardly extracted portions is provided in place of the outwardly extracted portions, a force required for bending the outwardly extracted portion is reduced in the case where the outwardly extracted portions are employed.

The outwardly extracted portions are extracted from the same surface of the base body portion (surface different from the surface where the connection portions are extracted) and are bent to the same direction (the direction along the lower surface of the terminal holding portion).

Since the light-emitting device of a side surface light emission type is used as a light source for a mobile phone in most cases, the entire size of the device is restricted. As a result, the base body portion configured by the resin molding generally is also likely to be a thin member.

In such a base body portion, when a large force is applied in the case of bending the outwardly extracted portion, the base body portion may be damaged. Thus, like the invention, it is desirable to provide the outwardly extracted portions to thereby reduce a force required for bending the outwardly extracted portion. Accordingly, since the base body portion is prevented from being applied with a large force at the time of bending the outwardly extracted portions, the damage of the base body portion can be prevented and so the yield thereof can be improved. Thus, the light-emitting device employing the configuration of the invention becomes cheap.

The third aspect of the invention is defined as follows.

That is, in the light-emitting device according to the first aspect, the outwardly extracted portion is extracted from the lower surface of the base body portion and bent along the lower surface of the terminal holding portion.

According to the invention of the third aspect thus defined, the outwardly extracted portions are extracted from the surface having the largest area, that is, the lower surface (in other words, the surface having the largest mechanical rigidity) of the base body portion. Thus, an allowable force at the time of bending the outwardly extracted portion becomes maximum and so the drawing portion of the outwardly extracted portion can be formed to have a large width. Thus, the heat conduction of the outwardly extracted portion can be promoted.

The fourth aspect of the invention is defined as follows.

That is, in the light-emitting device according to the third aspect, the connection portions are extracted from the side surface of the base body portion, then bent along the side surface and further bent along the lower surface of the terminal holding portion.

In the lead member, a pair of the connection portions are extracted outside from the side surface of the base body portion, then bent along the side surface and further bent along the lower surface of the terminal holding portion. Thus, portions electrically connected to the wiring board are disposed on the lower surface of the terminal holding portion. Although a pair of the connection portions and the outwardly extracted portions are extracted outward, the connection portions are extracted outside from the side surface of the base body portion and the outwardly extracted portions are extracted outside from the lower surface of the base body portion.

Since the light-emitting device of a side surface light emission type is used as a light source for a mobile phone in most cases, the entire size of the device is restricted. As a result, the base body portion configured by the resin molding generally is also likely to be a thin member. In such a base body portion, when the lead members are extracted from the same surface of the base body portion, a force at the time of bending is concentrated and so the mechanical intensity of the surface may degrade.

Thus, like the invention of this aspect, in the case of providing the lead member with the outwardly extracted portions so as to be extracted from the base body portion and bent, the surface of the base body portion from which the outwardly extracted portions are extracted preferably differs from the surface of the base body portion from which the connection portions are extracted. Thus, in the lead member, when the portion extracted from the base body portion is bent along the base body portion, such a phenomenon can be prevented from occurring that a stress is excessively concentrated on the one surface of the base body portion, whereby the damage can be prevented in advance and so the yield can be improved. Thus, the light-emitting device employing the configuration of the invention becomes cheap.

The fifth aspect of the invention is defined as follows.

That is, in the light-emitting device according to the fourth aspect, the outwardly extracted portion is disposed at the center portion between the pair of connection portions.

According to the invention of the fourth aspect thus defined, since the outwardly extracted portion is disposed at the center portion between the pair of connection portions, the short-circuit between the outwardly extracted portion and the connection portion can be further surely prevented at the time of mounting the light-emitting device on the wiring board. Further, since heat can be radiated to the wiring board also via the connection portions, when the connection positions of the pair of connection portions and the outwardly extracted portion with respect to the wiring board are uniformly distributed, heat of the light-emitting device can be transmitted to the wiring board more efficiently.

The sixth aspect of the invention is defined as follows.

That is, in the light-emitting device according to the second aspect, the terminal holding portion includes isolation portions between the pair of connection portions and the outwardly extracted portion and also between the outwardly extracted portions.

According to the invention of the sixth aspect thus defined, since the connection portion and the radiation plate are separated by the isolation portion of the terminal holding portion and also plural of the outwardly-extracted portions are separated by the isolation portion, the short circuit therebetween can be surely prevented.

The seventh aspect of the invention is defined as follows.

That is, in the light-emitting device according to the first to sixth aspects, the lead member includes a first lead member and a second lead member, an LED is mounted on the first lead member, and the outwardly extracted portions are extended from the first lead member.

According to the invention of the seventh aspect thus defined, since the outwardly extracted portions are extended from the first lead member on which the LED chip is mounted, heat generated from the LED chip can be dissipated efficiently.

BRIEF DESCRIPTION OF THE DRAWINGS

FIG. 1 are perspective views of the light-emitting device according to the first embodiment of the invention, in which FIG. 1(A) is a perspective view seen from the front side thereof and FIG. 1(B) is a perspective view seen from the rear side thereof.

FIG. 7 are Diagrams showing the lead member of second embodiment, in which FIG. 7A shows a state where lead members and a base body portion are assembled and FIG. 7B shows a state where the lead members and the base body portion are taken apart.

FIG. 9 are perspective views of the light-emitting device according to the third embodiment of the invention, in which FIG. 9(A) is a perspective view seen from the front side thereof and FIG. 9(B) is a perspective view seen from the rear side thereof.

FIG. 20 are perspective views of the light-emitting device according to the fourth embodiment of the invention, in which FIG. 20(A) is a perspective view seen from the front side thereof and FIG. 20(B) is a perspective view seen from the rear side thereof.

FIG. 26 shows Diagrams showing the lead member of fifth embodiment, in which FIG. 26A shows a state where lead members and a base body portion are assembled and FIG. 26B shows a state where the lead members and the base body portion are taken apart.

BRIEF DESCRIPTION OF THE PREFERRED EMBODIMENTS

First Embodiment

An embodiment according to the invention will be explained with reference to accompanied drawings.

Figure 2:
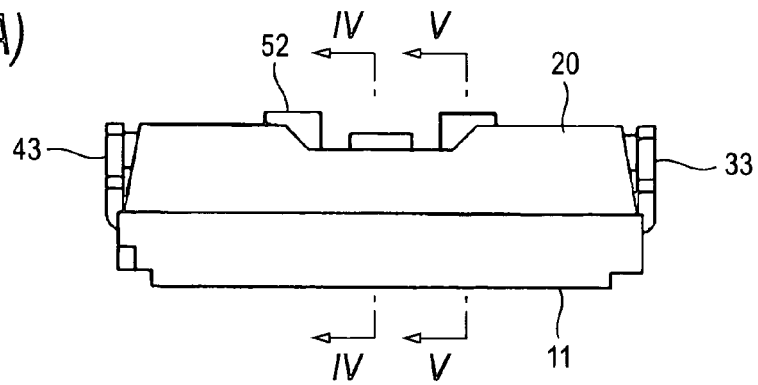
FIG. 2 shows the diagrams of the light-emitting device seen from six directions, in which (A) shows a plan view, (B) shows a left side view, (C) shows a front view, (D) shows a right side view, (E) shows a bottom view and (F) shows a rear view.
Figure 2:
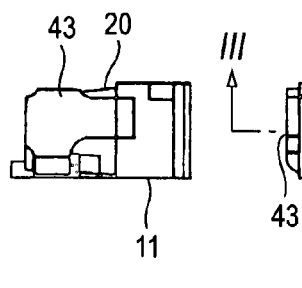
Figure 2:
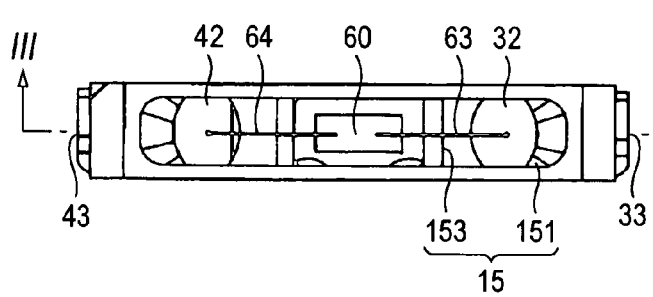
Figure 2:
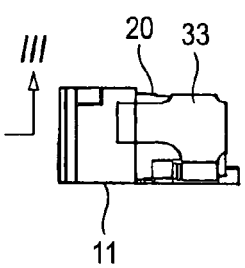
Figure 2:
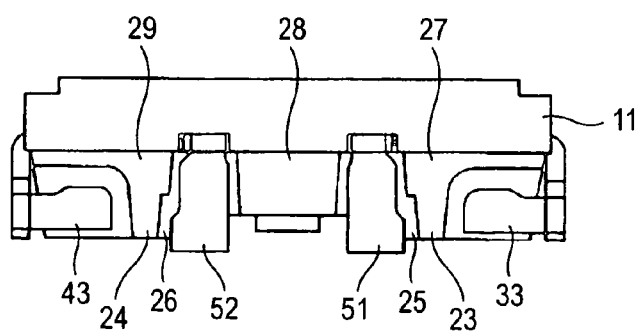
Figure 2:
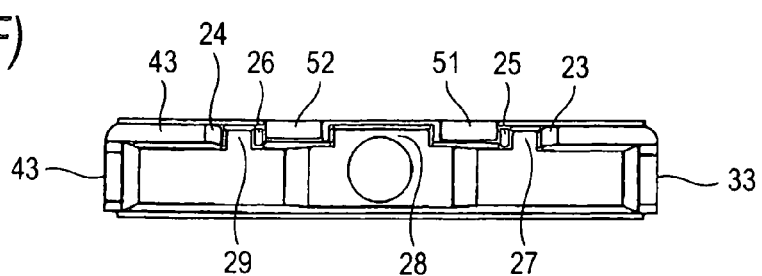
Figure 3:
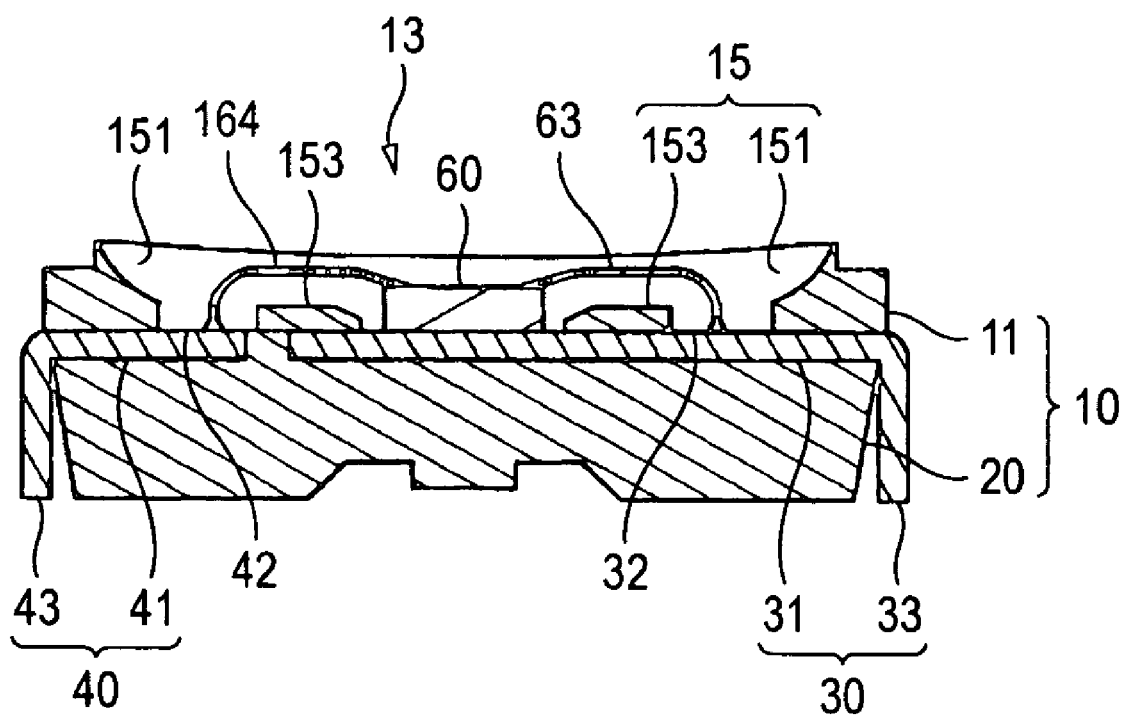
FIG. 3 is a sectional view cut along a line III-III in FIG. 2(C).
Figure 4:
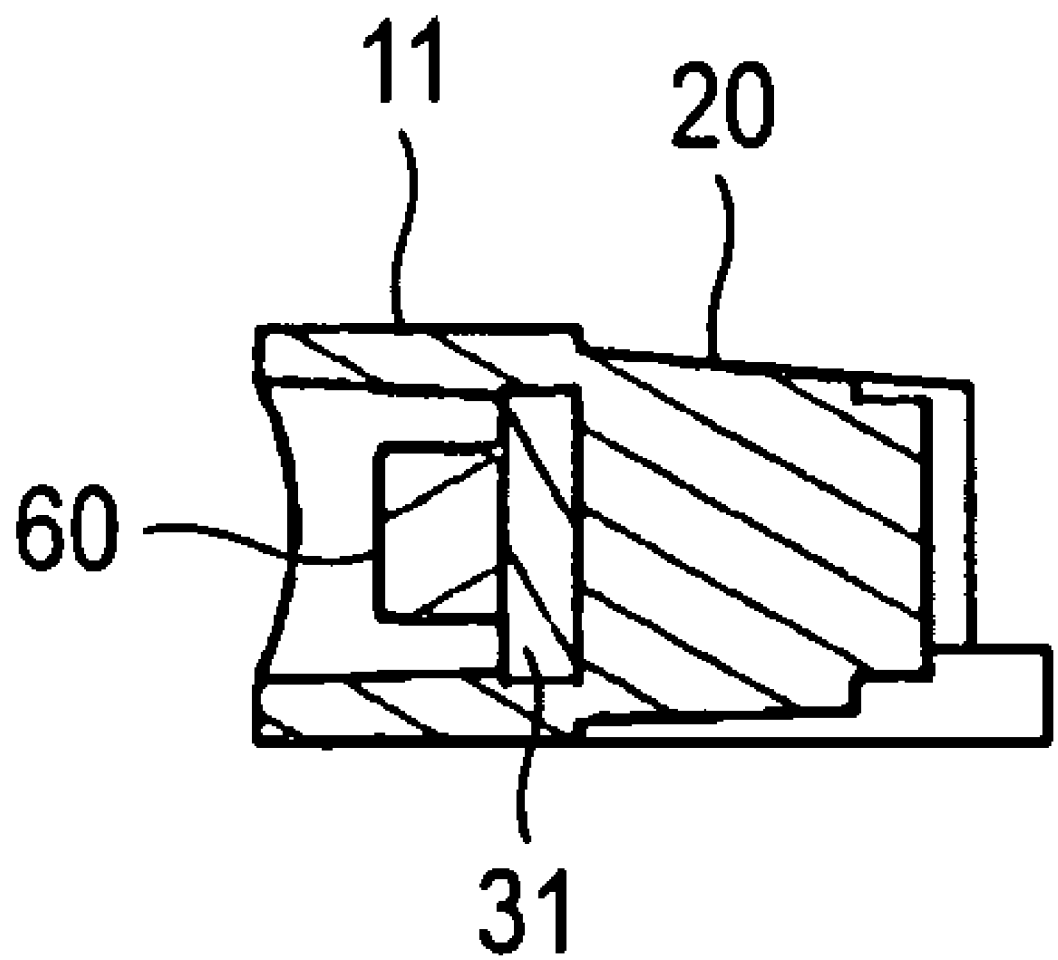
FIG. 4 is a sectional view cut along a line IV-IV in FIG. 2(A).
Figure 5:
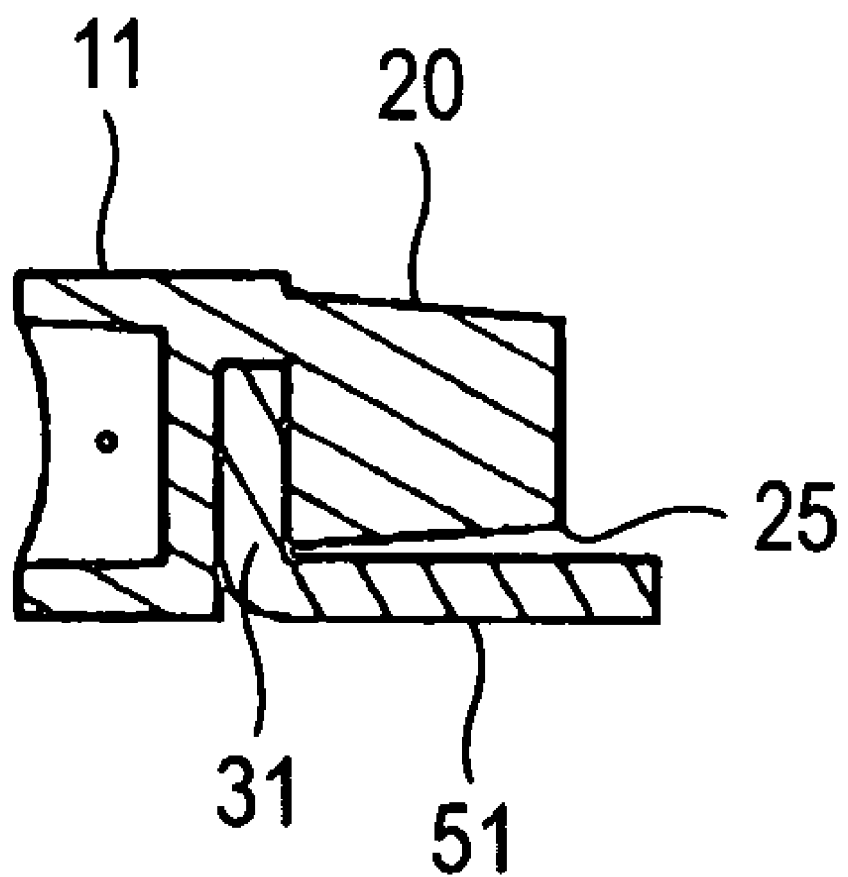
FIG. 5 is a sectional view cut along a line V-V in FIG. 2(A).

FIG. 1(A) is a perspective view of a light-emitting device 1 according to the embodiment seen from the front side thereof and FIG. 1(B) is a perspective view of the light-emitting device according to the embodiment seen from the rear side thereof. FIG. 2 shows the diagrams of the light-emitting device seen from six directions, in which (A) shows a plan view, (B) shows a left side view, (C) shows a front view, (D) shows a right side view, (E) shows a bottom view and (F) shows a rear view. FIG. 3 is a sectional view cut along a line III-III in FIG. 2(C), FIG. 4 is a sectional view cut along a line IV-IV in FIG. 2(A) and FIG. 5 is a sectional view cut along a line V-V in FIG. 2(A).

Figure 1:
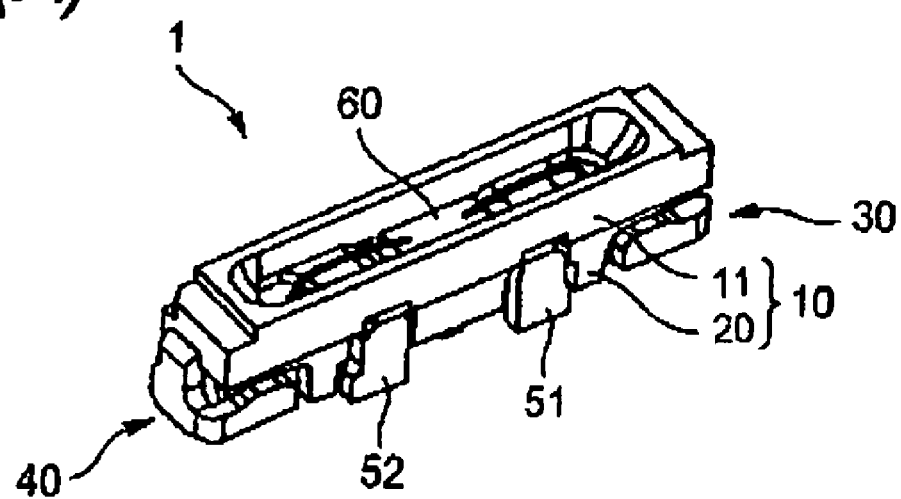
Figure 1:
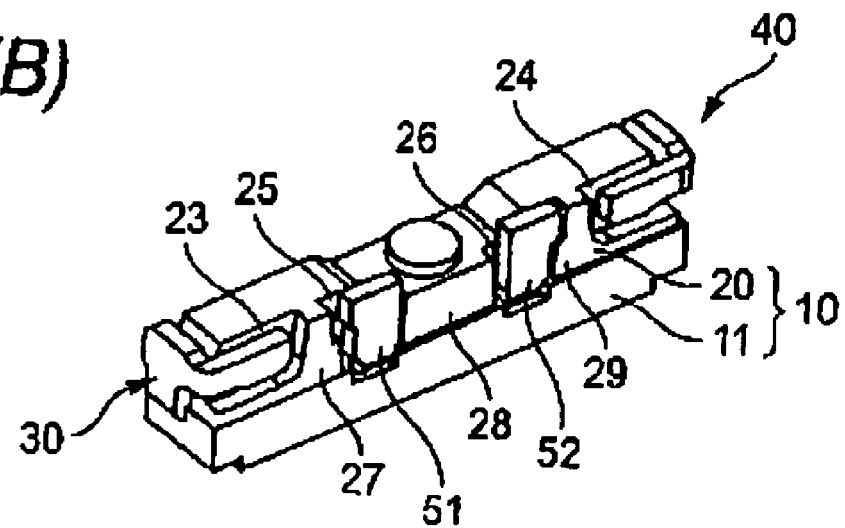

As shown in FIG. 1, the light-emitting device 1 according to the embodiment includes a base body portion 10, a first lead member 30, a second lead member 40 and an LED chip 60.

The base body portion 10 is configured by integrally forming a reflection case 11 and a terminal holding portion 20. The reflection case 11 has a longitudinal cap shape. The inner peripheral surface of the concave portion 13 of the reflection case forms a reflection surface 15.

The reflection surface 15 has a side wall portion 151 and a bottom portion 153. As clear from FIG. 3, the bottom portion 153 covers the lead members 30, 40 except for the LED chip 60 and the bonding regions 32, 42 of bonding wires 63, 64. The reflection surface can be coated by white paint etc. When the lead member is coated by the bottom portion 153 formed by resin material, a resin to resin contact area with respect to a sealing member formed by silicon resin increases and so the adhesiveness by the sealing resin can be improved.

The terminal holding portion 20 is integrally formed with the reflection case 11 at the rear side of the reflection case 11 and is solid entirely. Four notches 23, 24, 25 and 26 are formed at the terminal holding portion 20. The connecting portion 33 of the first lead member 30 enters into the first notch 23 in a holding manner. Similarly, the connecting portion 43 of the second lead member 40 enters into the second notch 24 in a holding manner. A radiation plate 51 enters into the third notch 25 in a holding manner. A radiation plate 52 enters into the fourth notch 26 in a holding manner. Each of the radiation plates 51, 52 is a part of the exposed portion of the first lead member extracted from the base body portion 10. The connecting portions 33, 43 and the radiation plates 51, 52 receptively entered into the notches 23, 24, 25 and 26 in a holding manner almost form the same plane as the lower surface of the terminal holding portion 20. Thus, the lead members 30, 40 can be prevented from being applied with an excessive impact.

A first isolation portion 27 acts as a solid portion for separating the first notch 23 and the third notch 25. A second isolation portion 28 acts as a solid portion for separating the third notch 25 and the fourth notch 26. A third isolation portion 29 acts as a solid portion for separating the fourth notch 26 and the second notch 24. Due to the presence of these first to third isolation portions 27, 28 and 29, the short circuit between the first and second connection portions 33, 43 and the radiation plates 51, 52 and the short circuit between the radiation plates 51 and 52 can be surely prevented. Further, when the connection portions 33, 43 and the radiation plates 51, 52 are extracted from the different surfaces of the base body portion and the area of each of the isolation portions (solid portions of the resin) is set to be large, damage (crack, chap etc.) of the base body portion can be prevented.

The first lead member 30 has an insert portion 31, the connection portion 33 and the radiation plates 51, 52. The insert portion 31 has a length of almost ¾ of the base body portion 10 in the longitudinal direction thereof. The LED chip 60 is mounted by the known method at a portion of the insert portion 31 corresponding to almost the center of the reflection case 11. The radiation plates 51, 52 are provided in an extended manner so as to sandwich the portion of the first lead member 30 where the LED chip 60 is mounted.

The portion extracted outside from the base body portion 10 in the first lead member 30 forms the connection portion 33. The connection portion 33 is firstly bent downward along the side surface of the terminal holding portion 20, then further bent along the lower surface of the terminal holding portion 20 and housed within the first notch 23.

The second lead member 40 includes an insert portion 41 and the connection portion 43. The insert portion 41 has a length of almost ¼ of the base body portion 10 in the longitudinal direction thereof.

The portion extracted outside from the base body portion 10 in the second lead member 40 forms the connection portion 43. The connection portion 43 is firstly bent downward along the side surface of the terminal holding portion 20, then further bent along the lower surface of the terminal holding portion 20 and housed within the second notch 24.

In the aforesaid configuration, the base body portion 10 can be formed by resin material such as nylon or inorganic material such as ceramics. The base body portion 10 may be made of molding material of white group having reflection property itself.

Each of the lead members may adapt a copper plate.

The III-group nitride compound semiconductor light-emitting element for emitting a light of a short wavelength may be employed as the LED chip. By combining this LED chip with suitable fluorescent material, white light can be emitted. In this embodiment, as the LED chip, a blue light-emitting diode and fluorescent material that absorbs blue light and emits light of yellow group are selected. The luminescent color of the LED chip can be selected arbitrarily. Further, a plurality of the LED chips may be mounted on the lead member.

The light-emitting device 1 according to the embodiment is manufactured in the following manner.

The copper plate is stamped or punched out to obtain the lead members 30, 40 in a state of being developed with the connection portions and the radiation plates. The base body portion 10 is formed by the injection molding by using the lead members 30, 40 as the insertion members. Thereafter, the LED chip 60 is mounted on the first lead member 30 and the wires 63, 64 are bonded. The LED chip 60 and the wires 63, 64 are sealed by translucent silicon resin in view of the durability. Fluorescent material may be dispersed within the silicon resin. Thereafter, the copper plate is cut to place in a state shown in FIG. 6.

Figure 6:
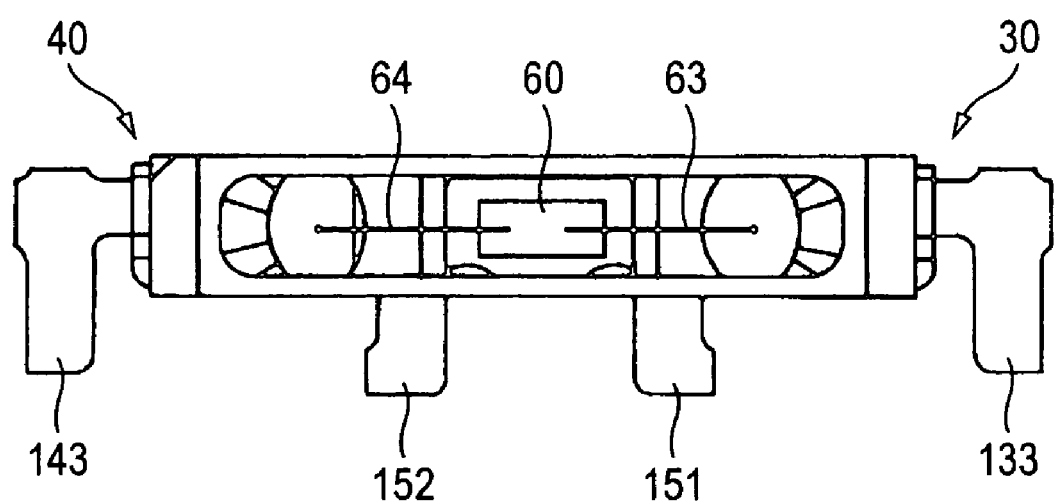
FIG. 6 is a diagram showing the manufacturing procedure of the light-emitting device according to the first embodiment.

In FIG. 6, the portion shown by a reference numeral 133 of the first lead member 30 extracted from the right side surface of the base body portion 10 in the drawing is bent along the terminal holding portion 20 to form the connection portion 33. Further, the portion shown by a reference numeral 143 of the second lead member 40 extracted from the left side surface of the base body portion 10 in the drawing is bent along the terminal holding portion 20 to form the connection portion 43. The portions shown by reference numerals 151, 152 of the first lead member 30 extracted from the lower surface of the base body portion 10 are bent along the terminal holding portion 20 to form the radiation plates 51, 52.

Since the lead members are extracted from the different surfaces of the base body portion 10 to each other, when the extracted portions are bent, the base body portion 10 can be prevented from being applied with an excessive load. Thus, the damage of the base body portion 10 can be prevented.

In particular, the two radiation plates 51, 52 are extracted from the lower surface of the base body portion 10 and bent. As compared with a case where a single radiation plate having the same area as those of the radiation plates 51, 52 as a following embodiment 3 is provided in place of providing the two radiation plates, a force required for bending the radiation plate is reduced in the case where these two radiation plates are employed. Thus, since a large force is not applied to the base body portion, the base body portion is not damaged at the time of bending the radiation plates. Therefore, the manufacturing yield can be improved and so the light-emitting device with a low cost can be provided.

The three or more radiation plates may be formed. In this case, also each of the radiation plates is extracted from the lower surface of the base body portion and bent along the lower surface of the terminal holding member. The shape of the radiation plates can be selected arbitrarily. The shapes of the respective radiation plates may be differentiated. The radiation plates may be designed largely so as to protrude from the bottom surface of the base body portion. In this case, at the time of assembling the light-emitting device to the wiring board, since the positions of the radiation plates can be visually confirmed, the positioning to the contact positions of the wiring board can be facilitated.

Since the connection portion also has the thermal conductivity, a pair of the connection portions and a plurality of the radiation plates disposed therebetween are desirably disposed to have a constant interval therebetween at the terminal holding portion.

Second Embodiment

Figure 7:
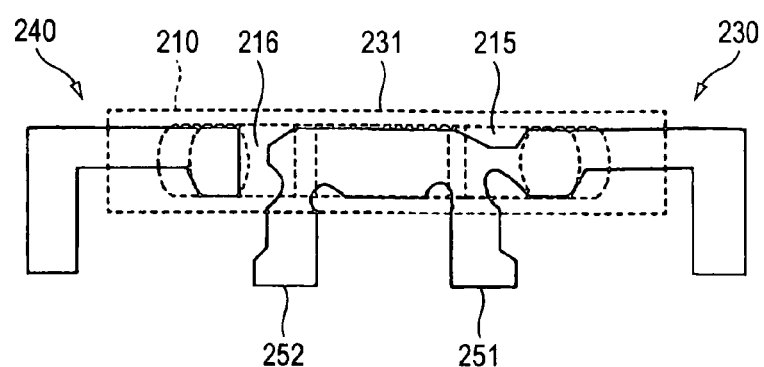
Figure 7:
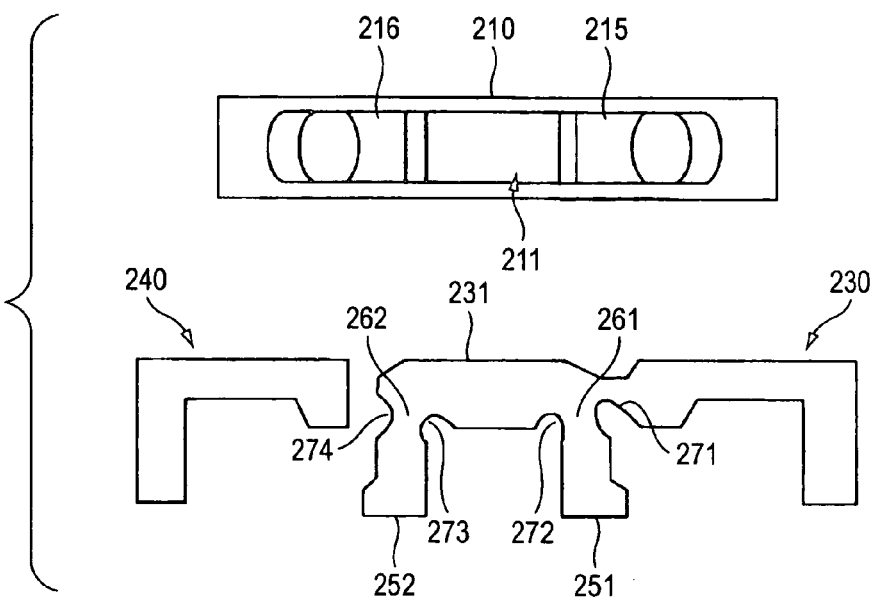

FIG. 7 shows a first lead member 230 and a second lead member 240 according to second embodiment. FIG. 7A shows a state where the first and second lead members 230, 240 are inserted into a base body portion 210. FIG. 7B is exploded diagrams respectively showing the first and second lead members 230, 240 and the base body portion 210. The first lead member 230 is configured in a manner that the base portion 231 thereof is inserted into the base body portion 210 and an LED chip is mounted on the base portion 231. A portion of the base body portion 210 opposing to the LED chip is formed as an opening portion 211. The base portion 231 is exposed via the opening portion 211 and the LED chip is mounted on the exposed portion. In the first lead member 230, coupling portions 261, 262 for coupling between portions 251, 252 constituting radiation portions and the base portion 231 respectively are covered by the material of the base body portion 210. The material portions 215, 216 of the base body portion constitute the bottom reflection surface of the reflection case. When the portions 251, 252 constituting the radiation portions are bent to the inner side in the drawing, the material portions 215, 216 press the base portion 231 to thereby prevent the base portion 231 from being turned up.

Further, since the coupling portions 261, 262 are formed to have small widths by concave portions 271 to 274, each of these coupling portions can be bent with a small force. Thus, the damage of the base body portion 210 can be prevented in advance.

Further, as shown in FIG. 7(A), each of the coupling portions 261, 262 having small widths is disposed within the width direction of the base body portion 210. In other words, since the width of each of the coupling portions 261, 262 is smaller than the width of the base body portion 210, in the case of bending the portions 251, 252 constituting the radiation portions from the base portion 231 at the coupling portions 261, 262 respectively, the base body portion 210 acts as the support portion for the bending. Thus, the bending procedure can be facilitated and the base portion 231 can be prevented from being exfoliated in advance.

In the aforesaid configuration, each of the concave portions 271 to 274 is bored toward the center axis direction of the base portion 231. Thus, since the bendable area is widened, the embodiment can be applied to the base body portion 210 having a smaller width. In other words, the degree of freedom of the design of the base body portion 210 can be improved.

Figure 8:
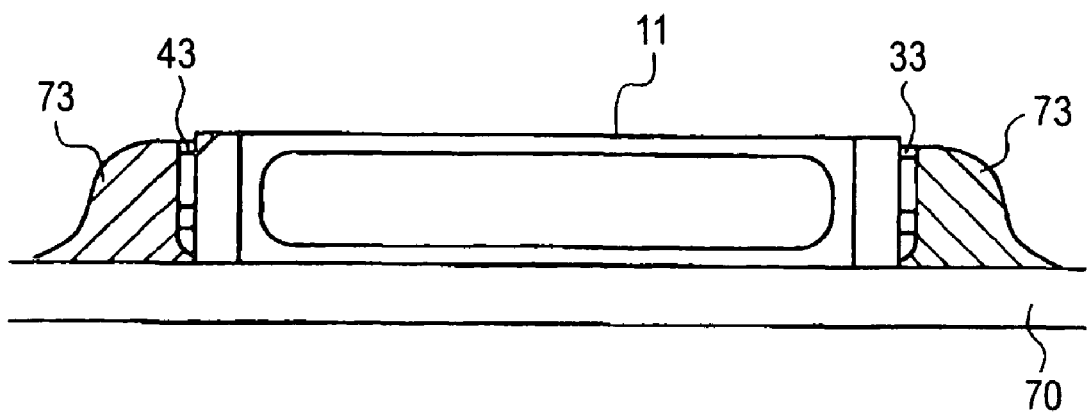
FIG. 8 is a diagram showing a using state of the light-emitting device according to the second embodiment.

FIG. 8 shows a using mode of the light-emitting device 1 according to the second embodiment.

In FIG. 8, a reference numeral 70 depicts a wiring board and a pattern of conductive metal material is formed on the surface of the wiring board. The connection portions 33, 43 are connected and soldered to the predetermined pattern of the wiring board. A reference numeral 73 depicts a solder. In this case, the radiation plates 51, 52 are preferably connected to the pattern portions on the surface of the wiring board. This is because the heat dissipation can be performed effectively by contacting the radiation plates 51, 52 to the metal material. In the wiring board, the radiation plates 51, 52 may be contacted to a thermal via (a portion of the metal material passing to the thickness direction of the wiring board through the wiring board).

According to the light-emitting element of the embodiment thus configured, heat generated from the LED chip 60 is mostly transmitted to the first lead member 30 and dissipated to the wiring board 70 via the radiation plates 51, 52 and the connection portion 33. Since the radiation plates 51, 52 are disposed near the LED chip 60, heat generated from the LED chip 60 can be dissipated efficiently.

Since the radiation plate is a part of the lead member, the radiation plate may be electrically coupled to the wiring board as an electrode. In this case, the degree of freedom of the pattern of the wiring board can be improved.

Third Embodiment

Although embodiments in which a plurality of the radiation plates are provided are disclosed in the first and second embodiments, in a third embodiment, an embodiment in which a single radiation plate is provided is disclosed. The third embodiment will be explained with reference to accompanied drawings.

Figure 10:
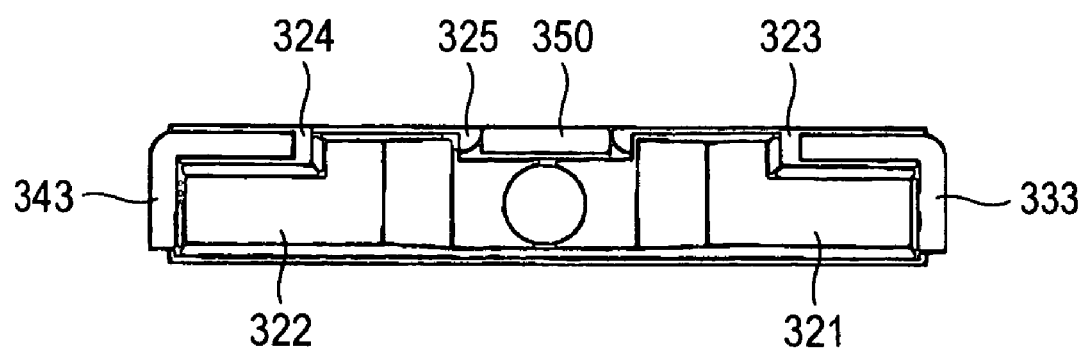
FIG. 10 is a rear view of the light-emitting device according to the third embodiment.
Figure 11:
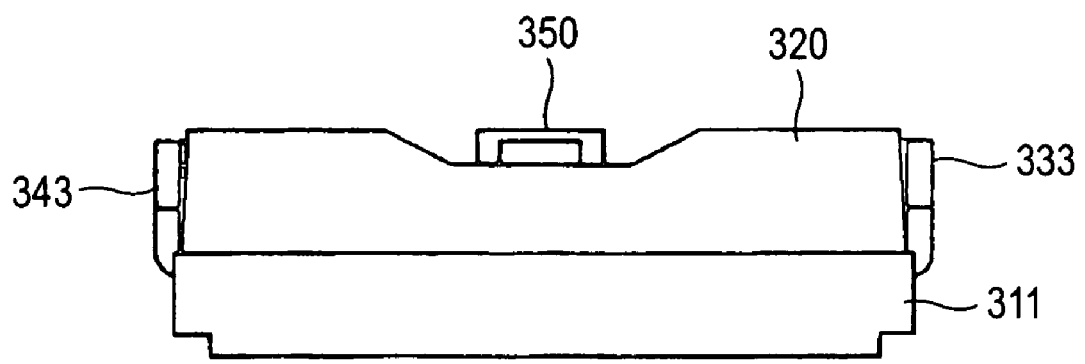
FIG. 11 is a plan view of the light-emitting device according to the third embodiment.
Figure 12:
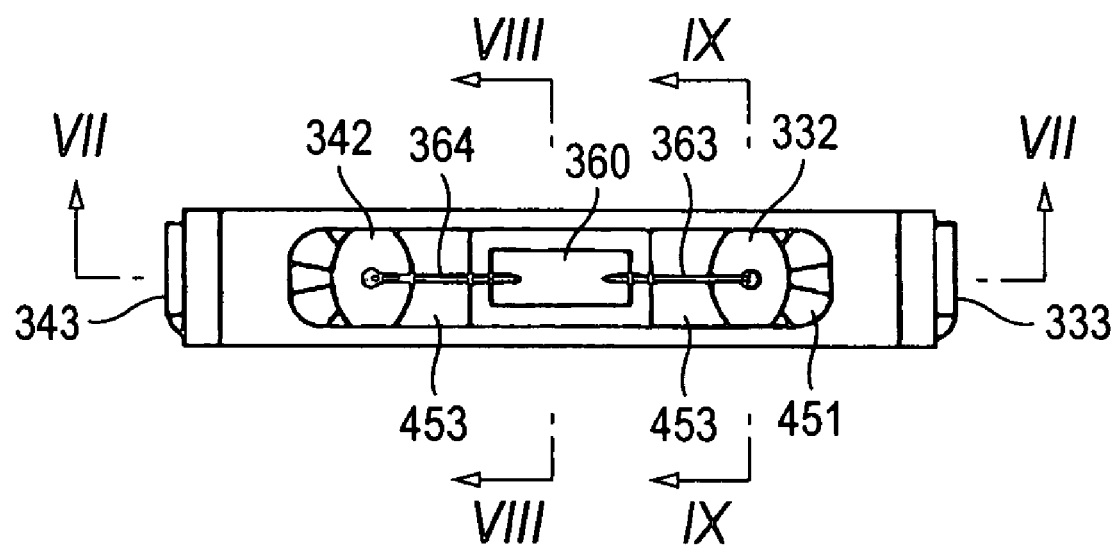
FIG. 12 is a front view of the light-emitting device according to the third embodiment.
Figure 13:
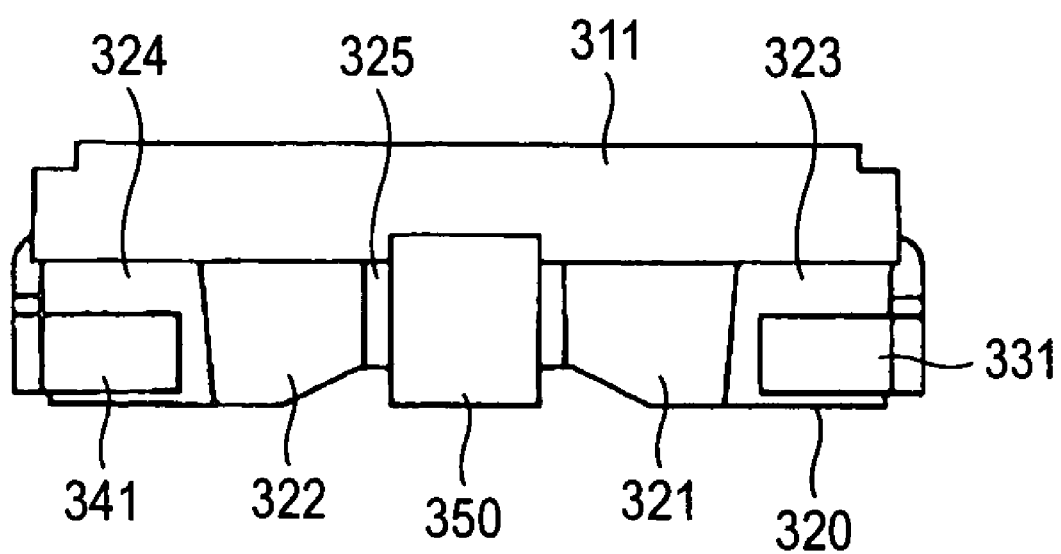
FIG. 13 is a bottom view of the light-emitting device according to the third embodiment.
Figure 14:
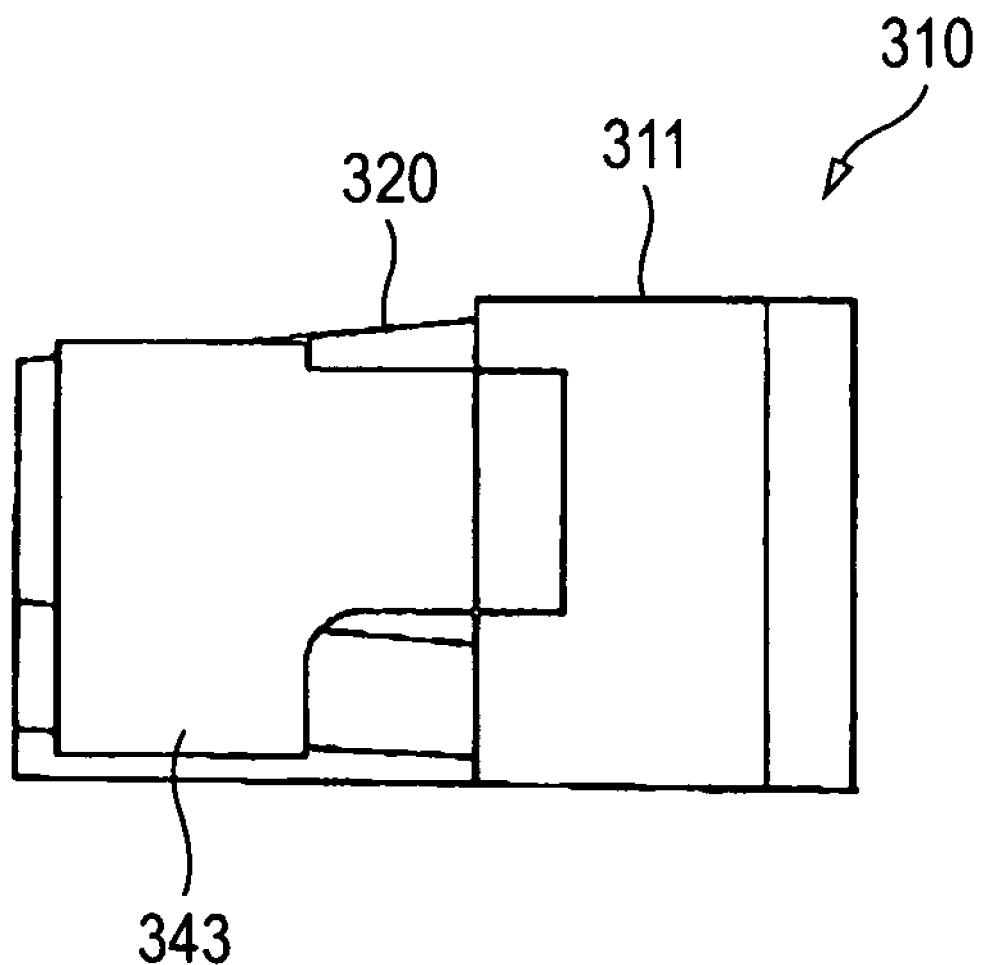
FIG. 14 is a side view of the light-emitting device according to the third embodiment.
Figure 15:
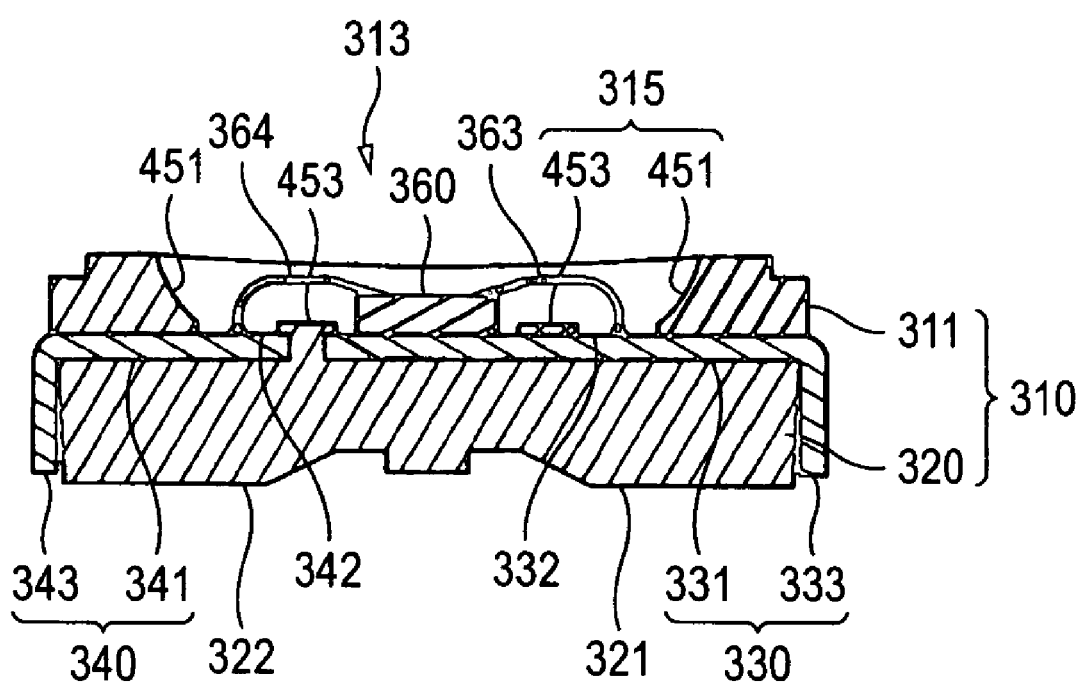
FIG. 15 is a sectional view cut along a line VII-VII in FIG. 12.
Figure 16:
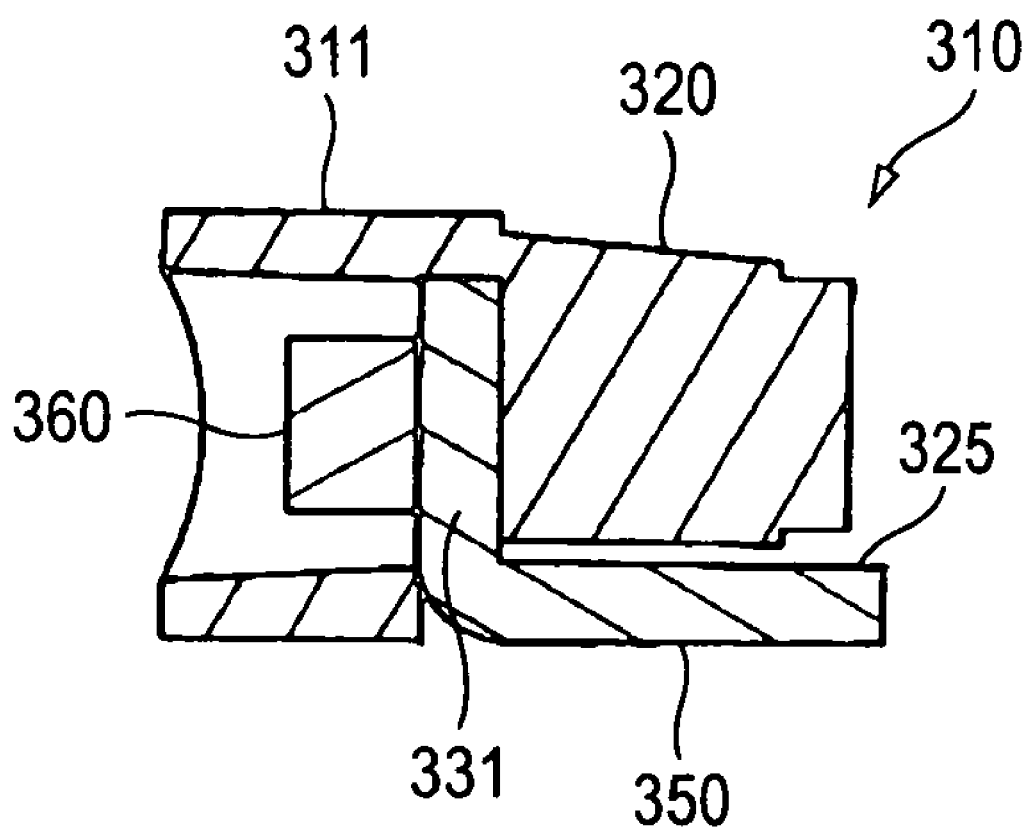
FIG. 16 is a sectional view cut along a line VIII-VIII in FIG. 12.
Figure 17:
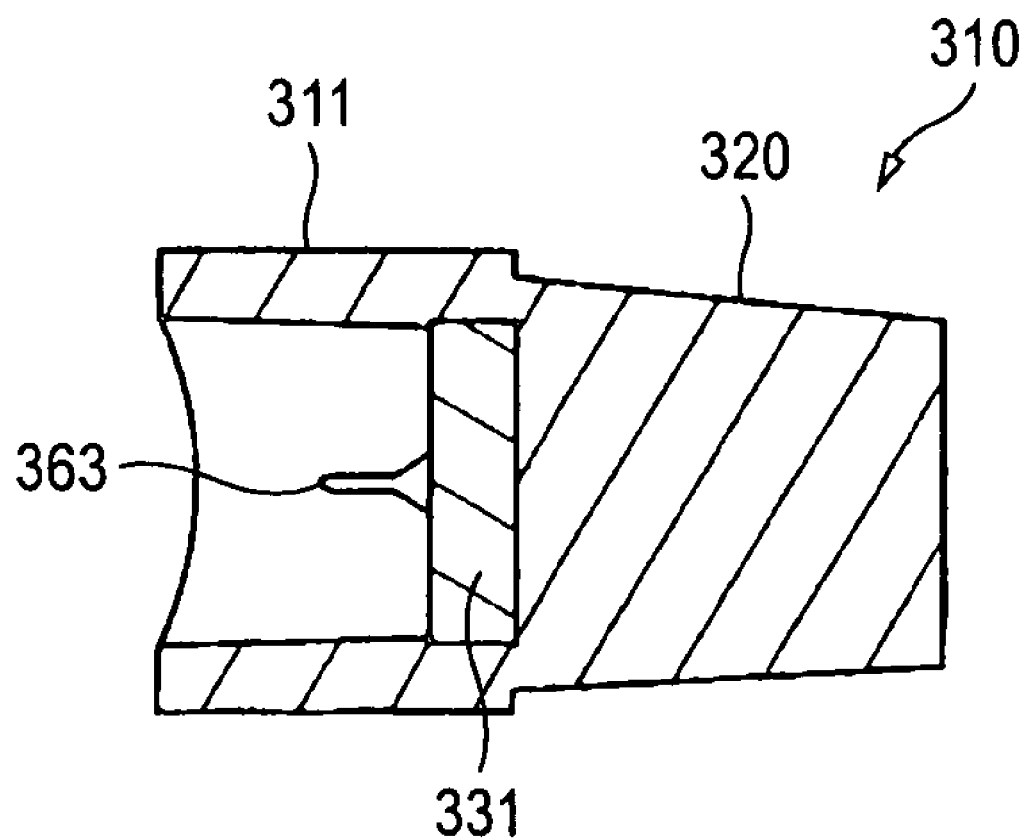
FIG. 17 is a sectional view cut along a line IX-IX in FIG. 12.

FIG. 9(A) is a perspective view of a light-emitting device 301 according to the embodiment seen from the front side thereof and FIG. 9(B) is a perspective view of the light-emitting device according to the embodiment seen from the rear side thereof. FIG. 10 is a rear view of the light-emitting device according to the embodiment, FIG. 11 is a plan view thereof, FIG. 12 is a front view thereof, FIG. 13 is a bottom view thereof and FIG. 14 is a side view thereof. FIG. 15 is a sectional view cut along a line VII-VII in FIG. 12, FIG. 16 is a sectional view cut along a line VIII-VIII in FIG. 12 and FIG. 17 is a sectional view cut along a line IX-IX in FIG. 12.

Figure 9:
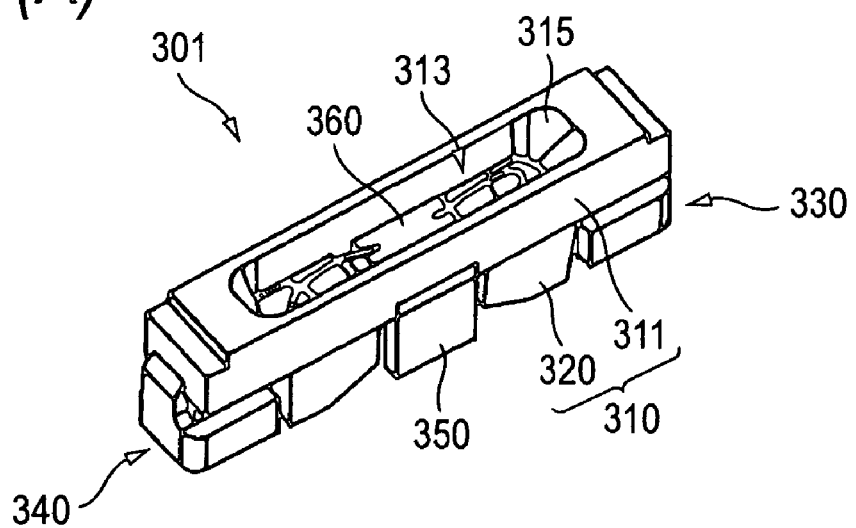
Figure 9:
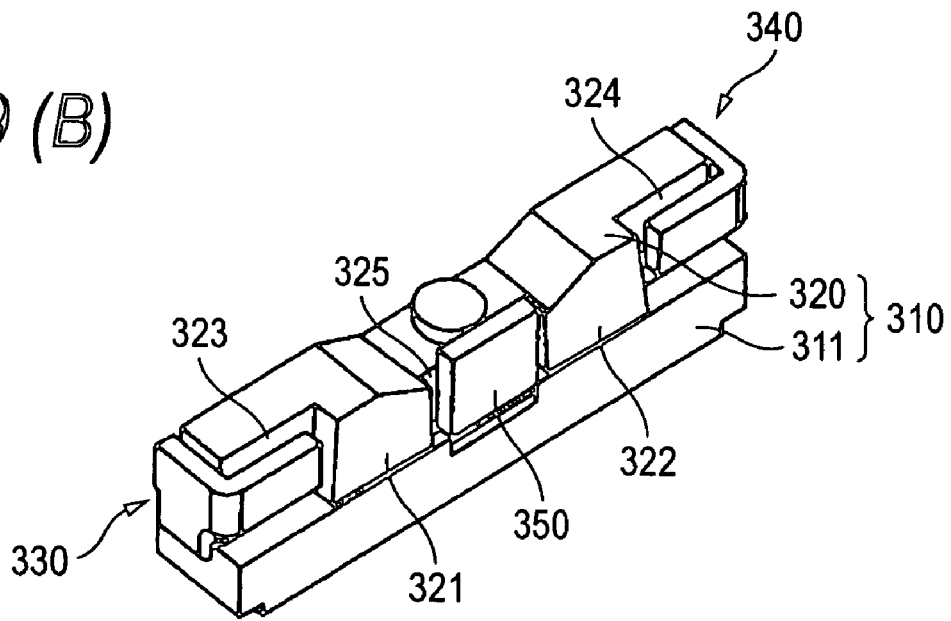

As shown in FIG. 9, the light-emitting device 301 according to the embodiment includes a base body portion 310, a first lead member 330, a second lead member 340 and an LED chip 360.

The base body portion 310 is configured by integrally forming a reflection case 311 and a terminal holding portion 320. The reflection case 311 has a longitudinal cap shape. The inner peripheral surface of the concave portion 313 of the reflection case forms a reflection surface 315.

The reflection surface 315 has a side wall portion 451 and a bottom portion 453. As clear from FIGS. 12 and 15, the bottom portion 453 covers the lead members 330, 340 except for the LED chip 360 and the bonding regions 332, 342 of bonding wires 363, 364. The reflection surface can be coated by white paint etc. When the lead member is coated by the bottom portion 453 formed by resin material, a resin to resin contact area with respect to a sealing member formed by silicon resin increases and so the adhesiveness by the sealing resin can be improved.

The terminal holding portion 320 is integrally formed with the reflection case 311 at the rear side of the reflection case 311 and is solid entirely. Three notches 323, 324 and 325 are formed at the terminal holding portion 320. The connecting portion 333 of the first lead member 330 enters into the first notch 323 in a holding manner. Similarly, the connecting portion 343 of the second lead member 340 enters into the second notch 324 in a holding manner. A radiation plate 350 enters into the third notch 325 in a holding manner. The radiation plate 350 is a part of the exposed portion of the first lead member extracted from the base body portion 310. The connecting portions 333, 343 and the radiation plate 350 receptively entered into the notches 323, 324 and 325 in a holding manner almost form the same plane as the lower surface of the terminal holding portion 320. Thus, the lead members 330, 340 can be prevented from being applied with an excessive impact.

A first isolation portion 321 acts as a solid portion for separating the first notch 323 and the third notch 325. A second isolation portion 322 acts as a solid portion for separating the second notch 324 and the third notch 325. Due to the presence of these first and second isolation portions 321, 322, the short circuit between the first and second lead members 330, 340 and the radiation plate 350 can be surely prevented. Further, when the connection portions 333, 343 and the radiation plate 350 are extracted from the different surfaces of the base body portion and the area of each of the isolation portions 321, 322 (solid portions of the resin) is set to be large, damage (crack, chap etc.) of the base body portion can be prevented.

The first lead member 330 has an insert portion 331, the connection portion 333 and the radiation plate 350. The insert portion 331 has a length of almost ⅔ of the base body portion 310 in the longitudinal direction thereof. The LED chip 360 is mounted by the known method at a portion of the insert portion 331 corresponding to almost the center of the reflection case 311. The radiation plate 350 is provided so as to be extended from the position of the first lead member 330 where the LED chip 360 is mounted.

The portion extracted outside from the base body portion 310 in the first lead member 330 forms the connection portion 333. The connection portion 333 is firstly bent downward along the side surface of the terminal holding portion 320, then further bent along the lower surface of the terminal holding portion 320 and housed within the first notch 323.

The second lead member 340 includes an insert portion 341 and the connection portion 343. The insert portion 341 has a length of almost ⅓ of the base body portion 310 in the longitudinal direction thereof.

The portion extracted outside from the base body portion 310 in the second lead member 340 forms the connection portion 343. The connection portion 343 is firstly bent downward along the side surface of the terminal holding portion 320, then further bent along the lower surface of the terminal holding portion 320 and housed within the second notch 324.

In the aforesaid configuration, the base body portion 310 can be formed by resin material such as nylon or inorganic material such as ceramics. The base body portion 310 may be formed of molding material of white group having reflection property itself. Each of the lead members may adapt a copper plate.

The III-group nitride compound semiconductor light-emitting element for emitting a light of a short wavelength may be employed as the LED chip. By combining this LED chip with suitable fluorescent material, white light can be emitted. In this embodiment, as the LED chip, a blue light-emitting diode and fluorescent material that absorbs blue light and emits light of yellow group are selected. The luminescent color of the LED chip can be selected arbitrarily. Further, a plurality of the LED chips may be mounted on the lead member.

The light-emitting device 301 according to the embodiment is manufactured in the following manner.

The copper plate is stamped or punched out to obtain the lead members 330, 340 in a state of being developed with the connection portions and the radiation plate. The base body portion 310 is formed by the injection molding by using the lead members 330, 340 as the insertion members. Thereafter, the LED chip 360 is mounted on the first lead member 330 and the wires 363, 364 are bonded. The LED chip 360 and the wires 363, 364 are sealed by translucent silicon resin in view of the durability. Fluorescent material etc. may be dispersed within the silicon resin.

Figure 18:
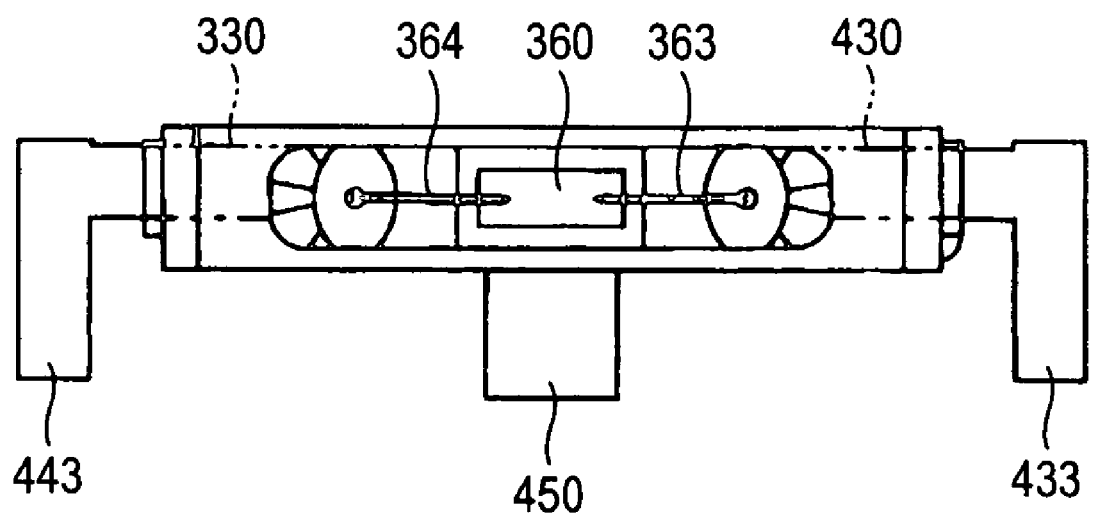
FIG. 18 is a diagram showing the manufacturing procedure of the light-emitting device according to the third embodiment.

Thereafter, the copper plate is cut to place in a state shown in FIG. 18.

In FIG. 18, the portion shown by a reference numeral 433 of the first lead member 330 extracted from the right side surface of the base body portion 310 in the drawing is bent along the terminal holding portion 320 to form the connection portion 333. Further, the portion shown by a reference numeral 443 of the second lead member 340 extracted from the left side surface of the base body portion 310 in the drawing is bent along the terminal holding portion 320 to form the connection portion 343. The portion shown by reference numeral 450 of the first lead member 330 extracted from the lower surface of the base body portion 310 is bent along the terminal holding portion 320 to form the radiation plate 350.

Since the lead members are extracted from the different surfaces of the base body portion 310 to each other, when the extracted portions are bent, the base body portion 310 can be prevented from being applied with an excessive load. Thus, the damage of the base body portion 310 can be prevented.

The shape of the radiation plates can be selected arbitrarily. The radiation plate may be designed largely so as to protrude from the bottom portion of the base body portion. In this case, at the time of assembling the light-emitting device to the wiring board, since the position of the radiation plate can be visually confirmed, the positioning to the contact position of the wiring board can be facilitated, FIG. 19 shows a using mode of the light-emitting device 301 according to the embodiment.

Figure 19:
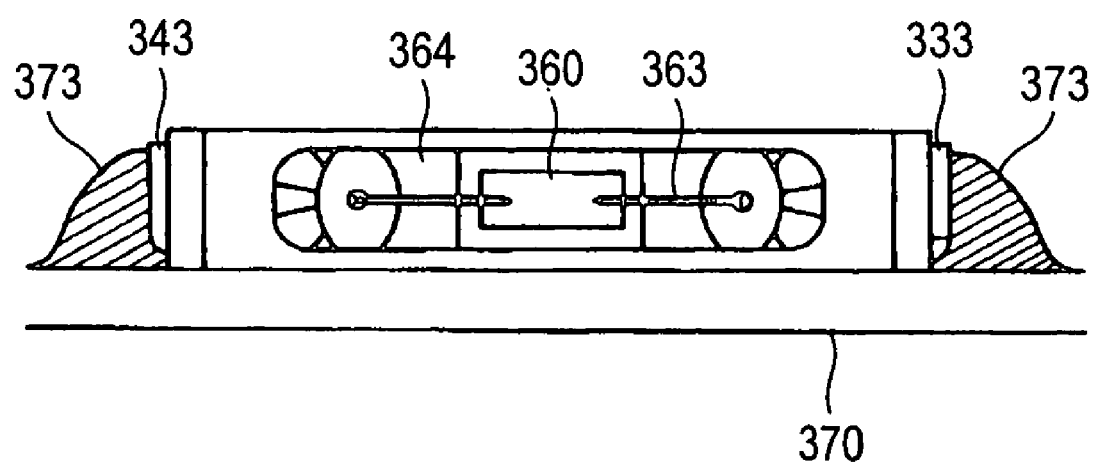
FIG. 19 is a diagram showing a using state of the light-emitting device according to the third embodiment.

In FIG. 19, a reference numeral 370 depicts a wiring board and a pattern of conductive metal material is formed on the surface of the wiring board. The connection portions 333, 343 are connected and soldered to the predetermined pattern of the wiring board. A reference numeral 373 depicts a solder. In this case, the radiation plate 350 is preferably connected to the pattern portion on the surface of the wiring board. This is because the heat dissipation can be performed effectively by contacting the radiation plate 350 to the metal material. In the wiring board, the radiation plate 350 may be contacted to a thermal via (a portion of the metal material passing to the thickness direction of the wiring board through the wiring board).

According to the light-emitting element of the embodiment thus configured, heat generated from the LED chip 360 is mostly radiated to the first lead member 330 and dissipated to the wiring board 370 via the radiation plate 350 and the connection portion 333. Since the radiation plate 350 is disposed near the LED chip 360, heat generated from the LED chip 360 can be dissipated efficiently.

Since the radiation plate is a part of the lead member, the radiation plate may be electrically coupled to the wiring board as an electrode. In this case, the degree of freedom of the pattern of the wiring board can be improved.

Hereinafter, the following item is disclosed.

The light-emitting device of a side surface light emission type to be surface mounted on the wiring board, includes:

the base body portion which is configured by integrally forming the reflection case and the terminal holding portion provided at the rear portion of the reflection case; and the lead member to be inserted into the base body portion, wherein the portions of the lead member extracted from the base body portion are bent along the terminal holding portion to form a pair of the connection portions to be connected to a pattern on the wiring board, respectively, the outwardly extracted portion is provided at the lead member, the outwardly extracted portion is extracted from the lower surface of the base body portion and bent along the lower surface of the terminal holding portion, and the connection portions are extracted from side surfaces of the base body portion, then bent along the side surfaces of the base body portion and bent along the lower surface of the terminal holding portion, respectively.

Fourth Embodiment

In a fourth embodiment, a different shape (construction) of the reflection case is disclosed. The fourth embodiment according to the invention will be explained with reference to accompanied drawings.

Figure 21:
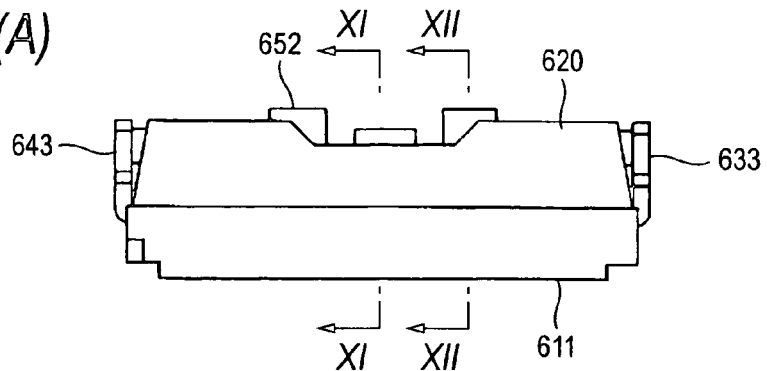
FIG. 21 shows the diagrams of the light-emitting device seen from six directions, in which (A) shows a plan view, (B) shows a left side view, (C) shows a front view, (D) shows a right side view, (E) shows a bottom view and (F) shows a rear view.
Figure 21:
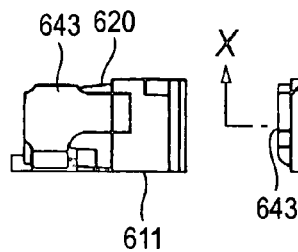
Figure 21:
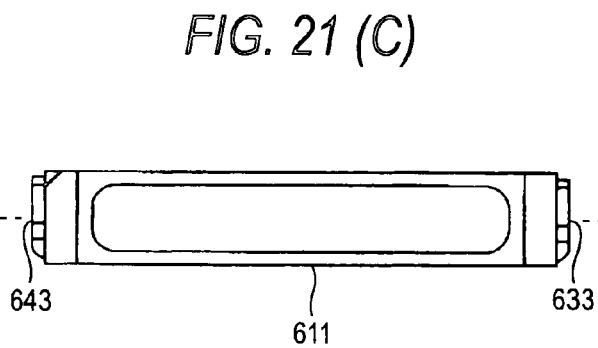
Figure 21:
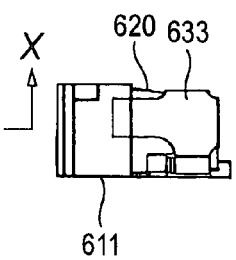
Figure 21:
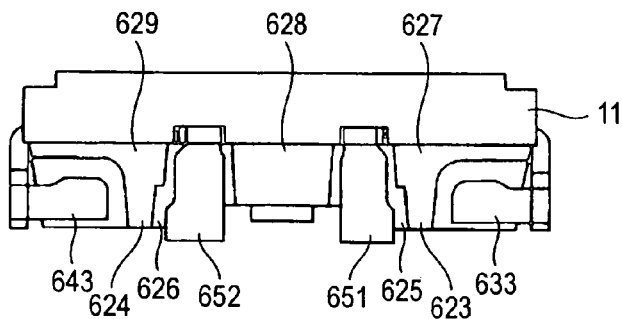
Figure 21:
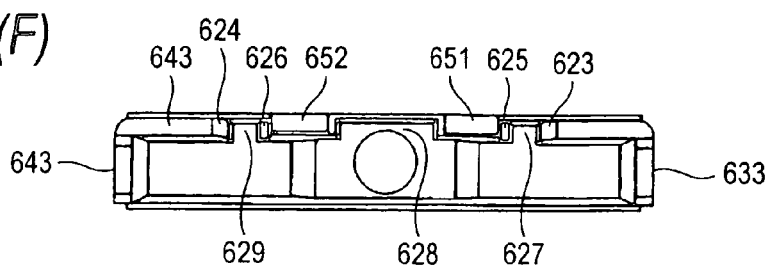
Figure 22:
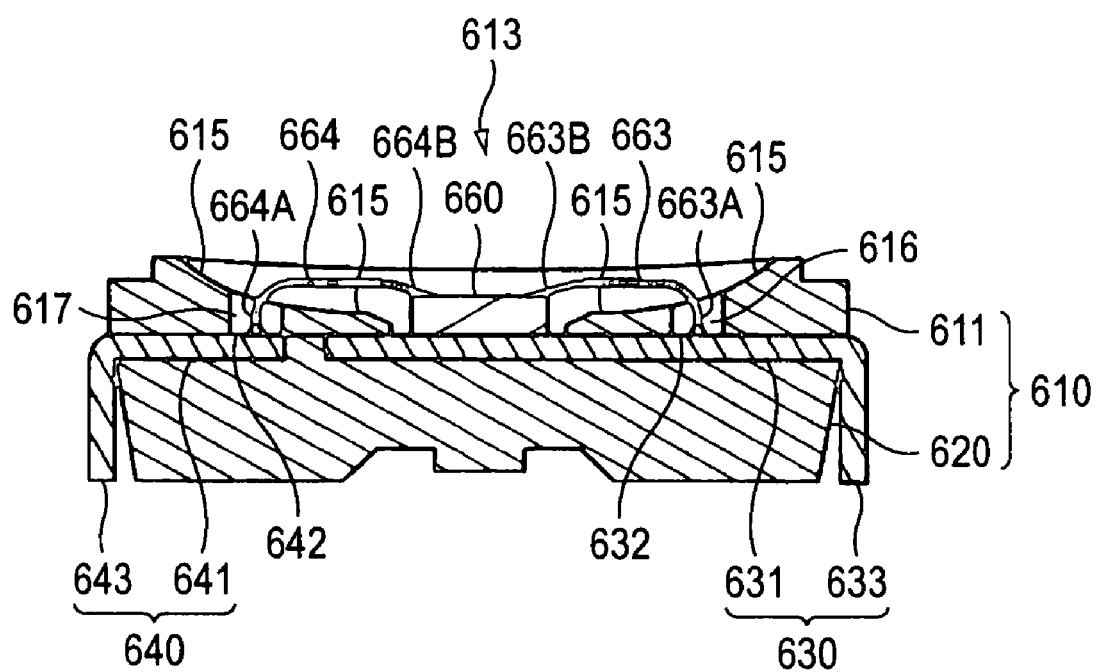
FIG. 22 shows a sectional view cut along a line X-X in FIG. 21(C).
Figure 23:
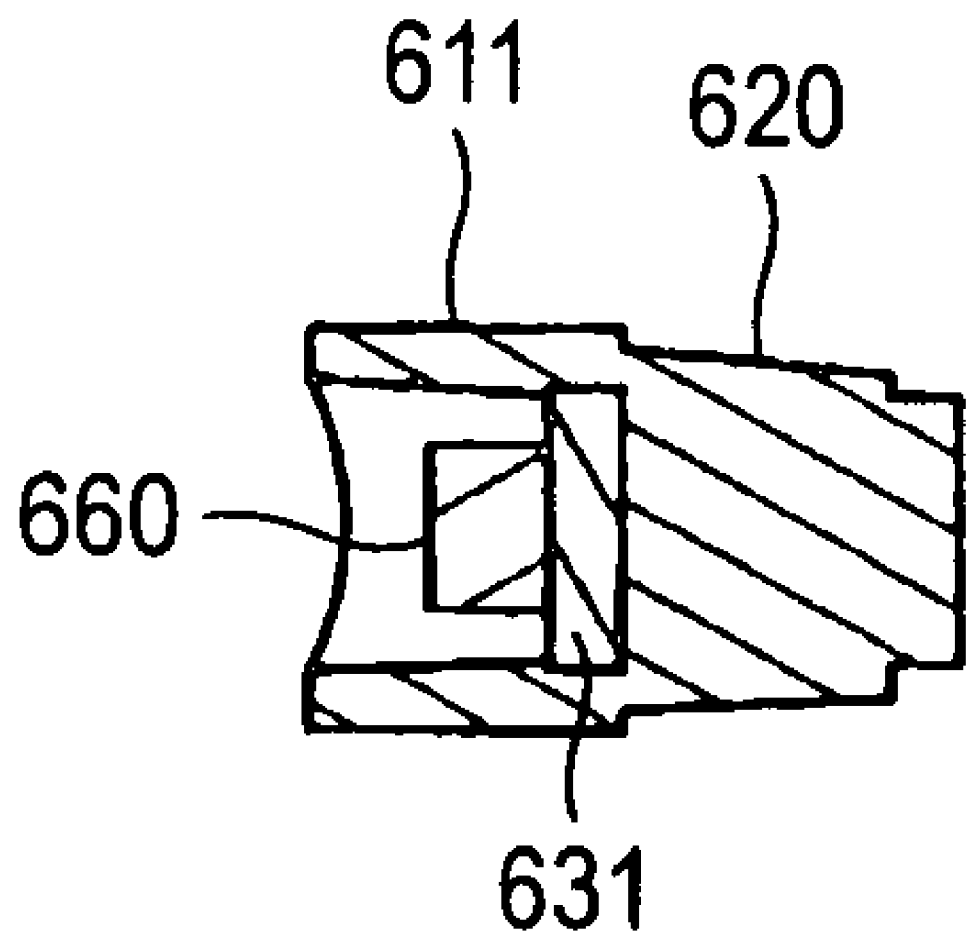
FIG. 23 shows a sectional view cut along a line XI-XI in FIG. 21(A).
Figure 24:
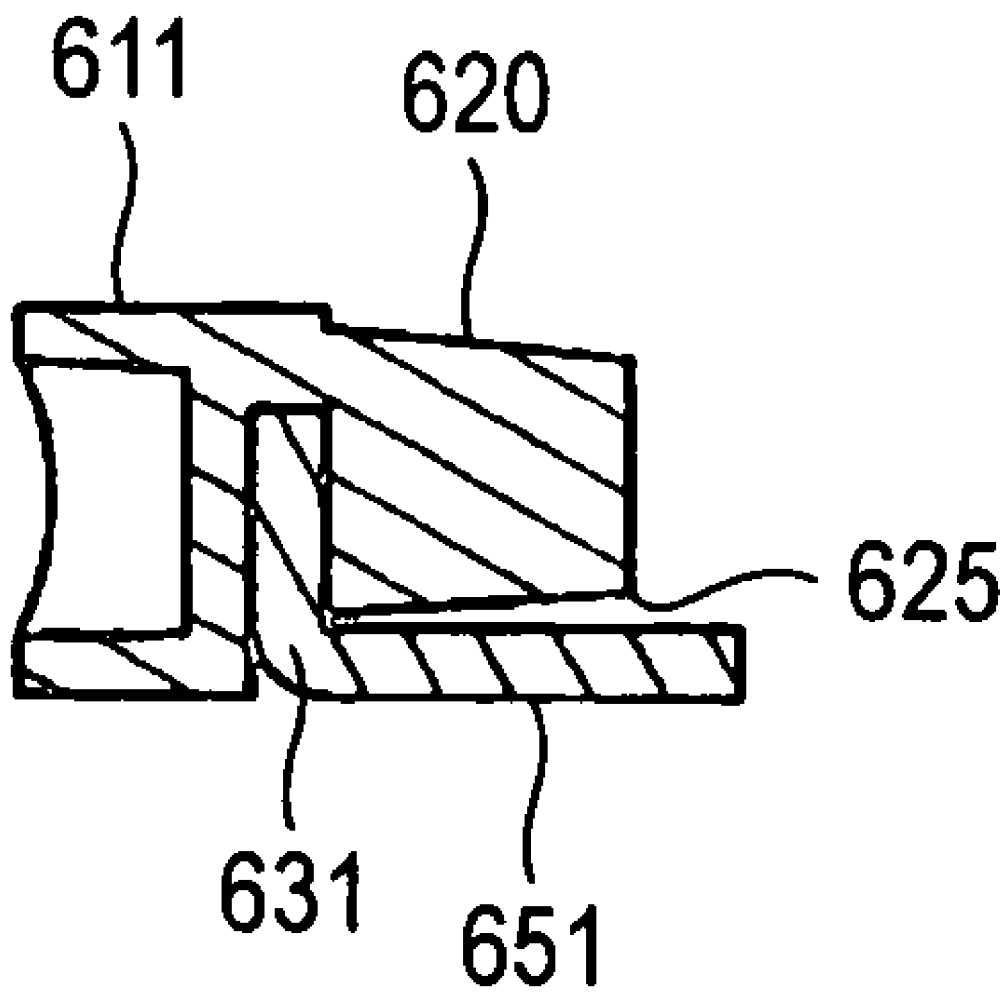
FIG. 24 shows a sectional view cut along a line XII-XII in FIG. 21(A).

FIG. 20(A) is a perspective view of a light-emitting device 601 according to the embodiment seen from the front side thereof and FIG. 20(B) is a perspective view of the light-emitting device according to the embodiment seen from the rear side thereof. FIG. 21 shows the diagrams of the light-emitting device seen from six directions, in which (A) shows a plan view, (B) shows a left side view, (C) shows a front view, (D) shows a right side view, (E) shows a bottom view and (F) shows a rear view. FIG. 22 is a sectional view cut along a line X-X in FIG. 21(C), FIG. 23 is a sectional view cut along a line XI-XI in FIG. 21(A) and FIG. 24 is a sectional view cut along a line XII-XII in FIG. 21(A).

Figure 20:
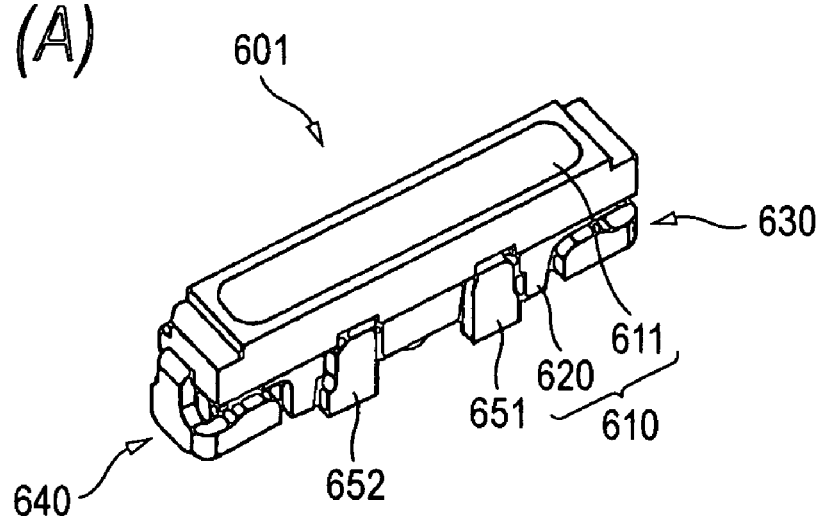
Figure 20:
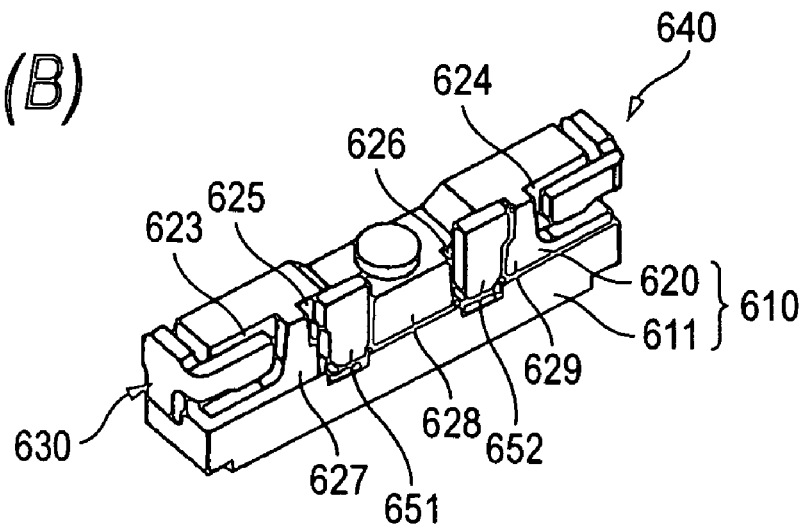

As shown in FIG. 20, the light-emitting device 601 according to the embodiment includes a base body portion 610, a first lead member 630, a second lead member 640 and an LED chip 660.

The base body portion 610 is configured by integrally forming a reflection case 611 and a terminal holding portion 620. The reflection case 611 has a longitudinal cap shape. The inner peripheral surface of the concave portion 613 of the reflection case forms a reflection surface 615.

The reflection surface 615 is entirely configured by a bowl shaped curved surface and the LED chip 660 is disposed at the center portion of the curvature. Since the entire surface of the reflection case is formed in the bowl shaped curved surface, light irradiated to the transverse or longitudinal directions from the LED chip 660 can be uniformly reflected to the optical axis direction of the reflection case 611 efficiency. It is preferable to configure the reflection surface 615 in a rotated parabola shape and to dispose the LED chip 660 at the origin of the parabola shape. The reflection surface 615 is provided with windows 616, 617 and bonding regions 632, 642 are exposed via the windows 616, 617, respectively. The reflection surface may be coated with white paint etc.

The windows 616, 617 are disposed so as to sandwich the LED chip 660 therebetween. The shape of each of the windows is not limited to a particular one so long as the bonding wires can be firstly bonded.

Since the reflection surface is configured in the curved surface entirely, bubbles hardly generate at the time of filling sealing member. Thus is because the reflection surface can be arranged to reduce corner portions that cause bubbles.

The terminal holding portion 620 is integrally formed with the reflection case 611 at the rear side of the reflection case 611 and is solid entirely. Four notches 623, 624, 625 and 626 are formed at the terminal holding portion 620. The connecting portion 633 of the first lead member 630 enters into the first notch 623 in a holding manner. Similarly, the connecting portion 643 of the second lead member 640 enters into the second notch 624 in a holding manner. A radiation plate 651 enters into the third notch 625 in a holding manner. A radiation plate 652 enters into the fourth notch 626 in a holding manner. Each of the radiation plates 651, 652 is a part of the exposed portion of the first lead member extracted from the base body portion 610. The connecting portions 633, 643 and the radiation plates 651, 652 receptively entered into the notches 623, 624, 625 and 626 in a holding manner almost form the same plane as the lower surface of the terminal holding portion 620. Thus, the lead members 630, 640 can be prevented from being applied with an excessive impact.

A first isolation portion 627 acts as a solid portion for separating the first notch 623 and the third notch 625. A second isolation portion 628 acts as a solid portion for separating the third notch 625 and the fourth notch 626. A third isolation portion 629 acts as a solid portion for separating the fourth notch 626 and the second notch 624. Due to the presence of these first to third isolation portions 627, 628 and 629, the short circuit between the first and second connection portions 633, 643 and the radiation plates 651, 652 and the short circuit between the radiation plates 651 and 652 can be surely prevented. Further, when the connection portions 633, 643 and the radiation plates 651, 652 are extracted from the different surfaces of the base body portion and the area of each of the isolation portions (solid portions of the resin) is set to be large, damage (crack, chap etc.) of the base body portion can be prevented.

The first lead member 630 has an insert portion 631, the connection portion 633 and the radiation plates 651, 652. The insert portion 631 has a length of almost ¾ of the base body portion 610 in the longitudinal direction thereof. The LED chip 660 is mounted by the known method at a portion of the insert portion 631 corresponding to almost the center of the reflection case 611. The radiation plates 651, 652 are provided in an extended manner so as to sandwich the portion of the first lead member 630 where the LED chip 660 is mounted.

The portion extracted outside from the base body portion 610 in the first lead member 630 forms the connection portion 633. The connection portion 633 is firstly bent downward along the side surface of the terminal holding portion 620, then further bent along the lower surface of the terminal holding portion 620 and housed within the first notch 623.

The second lead member 640 includes an insert portion 641 and the connection portion 643. The insert portion 641 has a length of almost ¼ of the base body portion 610 in the longitudinal direction thereof.

The portion extracted outside from the base body portion 610 in the second lead member 640 forms the connection portion 643. The connection portion 643 is firstly bent downward along the side surface of the terminal holding portion 620, then further bent along the lower surface of the terminal holding portion 620 and housed within the second notch 624.

In the aforesaid configuration, the base body portion 610 can be formed by resin material such as nylon or inorganic material such as ceramics. The base body portion 610 may be formed of molding material of white group having reflection property itself. Each of the lead members may adapt a copper plate.

A III-group nitride compound semiconductor light-emitting element for emitting a light of a short wavelength may be employed as the LED chip. By combining this LED chip with suitable fluorescent material, white light can be emitted. In this embodiment, as the LED chip, a blue light-emitting diode and fluorescent material that absorbs blue light and emits light of yellow group are selected. The luminescent color of the LED chip can be selected arbitrarily. Further; a plurality of the LED chips may be mounted on the lead member.

The light-emitting device 601 according to the embodiment is manufactured in the following manner.

The copper plate is stamped or punched out to obtain the lead members 630, 640 in a state of being developed with the connection portions and the radiation plates. The base body portion 610 is formed by the injection molding by using the lead members 630, 640 as the insertion members. Thereafter, the LED chip 660 is mounted on the first lead member 630 and the wires 663, 664 are bonded (see FIG. 22).

In this case, the one end (first bond end 663A) of the bonding wire 663 held by a not-shown head of a bonding device is firstly joined to the bonding region 632 of the lead member 630. The joining method is a melting and adhering (ball bonding) using ultrasonic wave, heat, load etc. Thereafter, the head is moved in the vertical direction from the bonding region 632 while feeding the bonding wire 663 out, in order to prevent the joining portion from being applied with a load in the transverse direction to thereby prevent the breakage of the joining portion. When the head is lifted up to the predetermined height, the head is moved in the transverse direction. Then, the other end (second bond end 663B) of the bonding wire 663 is joined to the predetermined electrode of the LED chip 660. The joining method is the wedge bonding (tailless bonding). The bonding wire 663 is cut after the joining procedure is performed.

Figure 28:
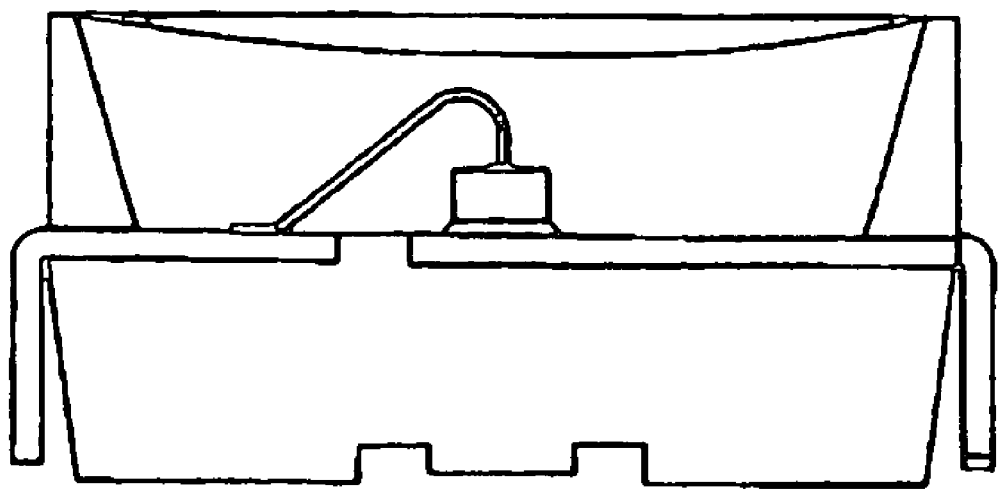
FIG. 28 is a sectional diagram showing the configuration of the light-emitting device of a related art.

In the bonding wire 663 where the bonding procedure is performed in this manner, the height of the first bond end 663A joined to the lead member 630 defines the entire height. When the configuration of the embodiment is compared with an example of the related art (see FIG. 28) where the first bond end 663A is joined to the LED chip, it will be understood that the height of the bonding wire is lower as a whole than the related art. Thus, the reflection case 611 can be formed to have a small depth (in this case, the width represents the length in the vertical direction in FIG. 22) and so the light-emitting device can cope with the needs for the miniaturization. Further, an amount of the material used for the bonding wire can be reduced.

Further, when the windows are formed at the reflection surface, a sealing member for covering the reflection surface enters into the windows, and hence the sealing member hardly comes out from the reflection surface. According to the reflection surface of the invention which is curved entirely as compared with the flat bottom reflection surface, since the window has a longer depth, the sealing member adheres to the reflection surface more firmly.

The bonding wire 664 is disposed in the similar manner. That is, the first bond end 664A of this bonding wire is joined to the bonding region 642 of the lead member 40 and the second bond end 664B of this bonding wire is joined to the predetermined electrode of the LED chip 660.

The LED chip 660 and the bonding wires 663, 664 are sealed by transparent silicon resin in view of the durability. Fluorescent material may be dispersed within the silicon resin.

Figure 25:
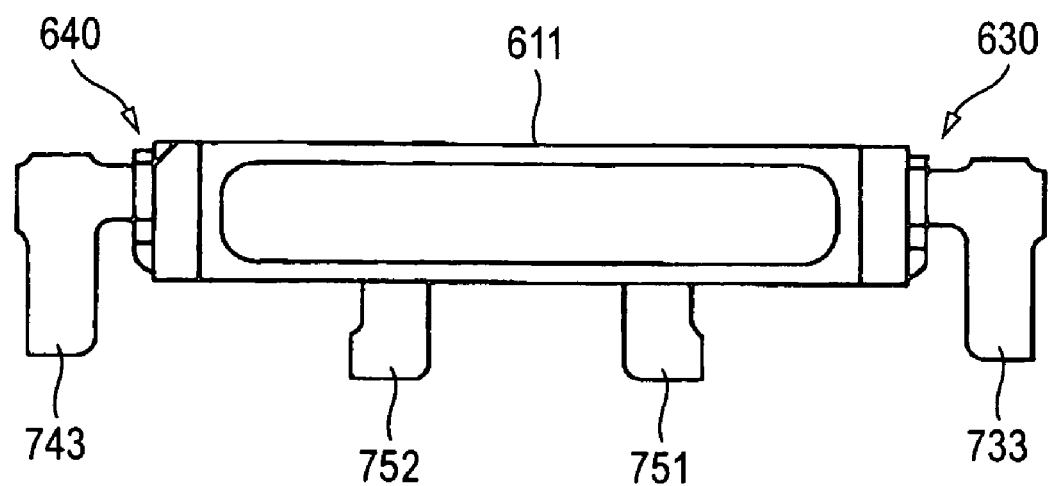
FIG. 25 shows a diagram showing the manufacturing procedure of the light-emitting device according to the fourth embodiment.

Thereafter, the copper plate is cut to place in a state shown in FIG. 25.

In FIG. 25, the portion shown by a reference numeral 733 of the first lead member 630 extracted from the right side surface of the base body portion 610 in the drawing is bent along the terminal holding portion 620 to form the connection portion 633. Further, the portion shown by a reference numeral 743 of the second lead member 640 extracted from the left side surface of the base body portion 610 in the drawing is bent along the terminal holding portion 620 to form the connection portion 643. The portions shown by reference numerals 751, 752 of the first lead member 630 extracted from the lower surface of the base body portion 610 are bent along the terminal holding portion 620 to form the radiation plates 651, 652.

Since the lead members are extracted from the different surfaces of the base body portion 610 to each other, when the extracted portions are bent, the base body portion 610 can be prevented from being applied with an excessive load. Thus, the damage of the base body portion 610 can be prevented.

In particular, the two radiation plates 651, 652 are extracted from the lower surface of the base body portion 610 and bent. As compared with a case where a single radiation plate having the same area as those of the radiation plates 651, 652 is provided in place of providing the two radiation plates, a force required for bending the radiation plate is reduced in the case where these two radiation plates are employed. Thus, since a large force is not applied to the base body portion, the base body portion is not damaged at the time of bending the radiation plates. Therefore, the manufacturing yield can be improved and so the light-emitting device with a low cost can be provided.

The three or more radiation plates may be formed. In this case, also each of the radiation plates is extracted from the lower surface of the base body portion and bent along the lower surface of the terminal holding member. The shape of the radiation plates can be selected arbitrarily. The shapes of the respective radiation plates may be differentiated. The radiation plates may be designed largely so as to protrude from the bottom surface of the base body portion. In this case, at the time of assembling the light-emitting device to the wiring board, since the positions of the radiation plates can be visually confirmed, the positioning to the contact positions of the wiring board can be facilitated.

Since the connection portion also has the thermal conductivity, a pair of the connection portions and a plurality of the radiation plates disposed therebetween are desirably disposed to have a constant interval therebetween at the terminal holding portion.

Figure 26:
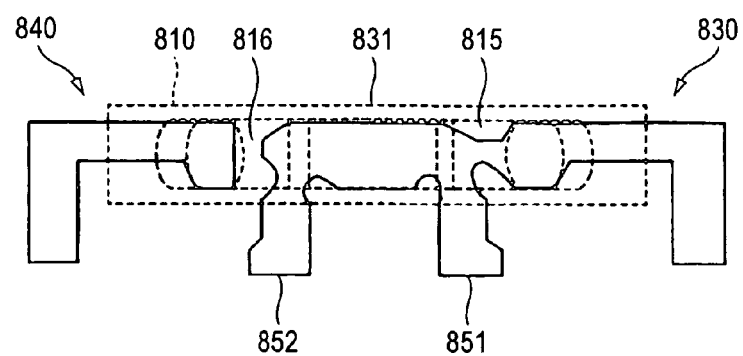
Figure 26:
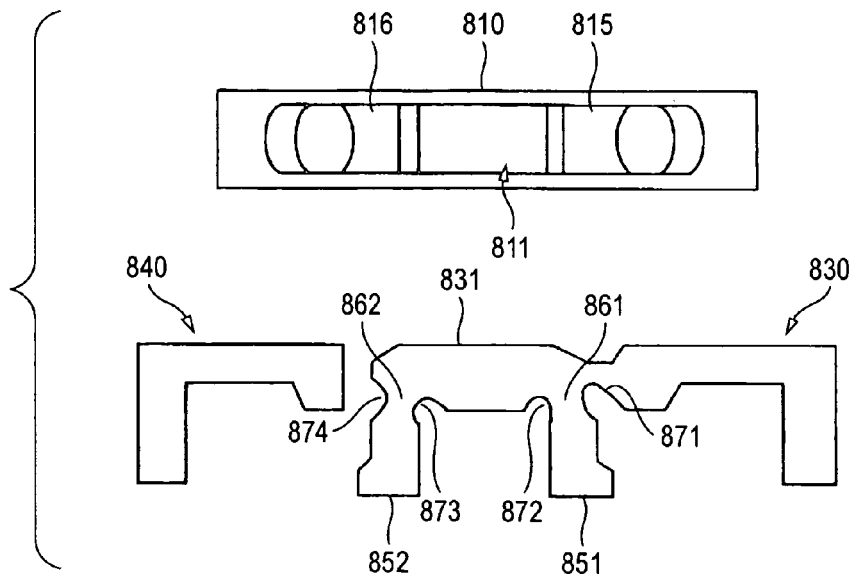

FIG. 26 shows a first lead member 830 and a second lead member 840 according to another embodiment. FIG. 26A shows a state where the first and second lead members 830, 840 are inserted into a base body portion 810. FIG. 26B is exploded diagrams respectively showing the first and second lead members 830,840 and the base body portion 810. The first lead member 830 is configured in a manner that the base portion 831 thereof is inserted into the base body portion 810 and an LED chip is mounted on the base portion 831. A portion of the base body portion 810 opposing to the LED chip is formed as an opening portion 811. The base portion 831 is exposed via the opening portion 811 and the LED chip is mounted on the exposed portion. In the first lead member 830, coupling portions 861, 862 for coupling between portions 851, 852 constituting radiation portions and the base portion 831 respectively are covered by the material of the base body portion 810. The material portions 815, 816 of the base body portion constitute the bottom reflection surface of the reflection case. When the portions 851, 852 constituting the radiation portions are bent to the inner side in the drawing, the material portions 815, 816 press the base portion 831 to thereby prevent the base portion 831 from being turned up.

Further, since the coupling portions 861, 862 are formed to have small widths by concave portions 871 to 874, each of these coupling portions can be bent with a small force. Thus, the damage of the base body portion 810 can be prevented in advance.

Further, as shown in FIG. 26(A), each of the coupling portions 861, 862 having small widths is disposed within the width direction of the base body portion 810. In other words, since the width of each of the coupling portions 861, 862 is smaller than the width of the base body portion 810, in the case of bending the portions 851, 852 constituting the radiation portions from the base portion 831 at the coupling portions 861, 862 respectively, the base body portion 810 acts as the support portion for the bending. Thus, the bending procedure can be facilitated and the base portion 831 can be prevented from being exfoliated in advance.

In the aforesaid configuration, each of the concave portions 871 to 874 is bored toward the center axis direction of the base portion 831. Thus, since the bendable area is widened, the embodiment can be applied to the base body portion 810 having a smaller width. In other words, the degree of freedom of the design of the base body portion 810 can be improved.

Figure 27:
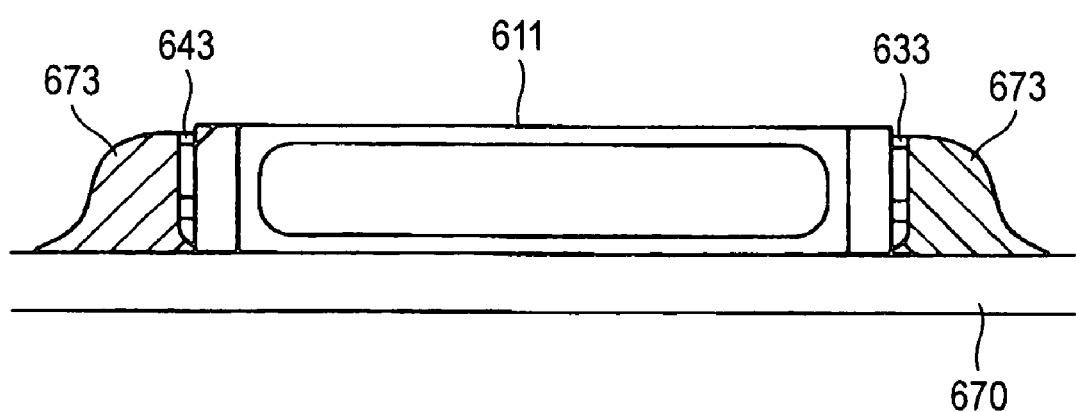
FIG. 27 is a diagram showing a using state of the light-emitting device according to the fourth embodiment.

FIG. 27 shows a using mode of the light-emitting device 601 according to the embodiment.

In FIG. 27, a reference numeral 670 depicts a wiring board and a pattern of conductive metal material is formed on the surface of the wiring board. The connection portions 633, 643 are connected and soldered to the predetermined pattern of the wiring board. A reference numeral 673 depicts a solder. In this case, the radiation plates 651, 652 are preferably connected to the pattern portions on the surface of the wiring board. This is because the heat dissipation can be performed effectively by contacting the radiation plates 651, 652 to the metal material. In the wiring board, the radiation plates 651, 652 may be contacted to a thermal via (a portion of the metal material passing to the thickness direction of the wiring board through the wiring board).

According to the light-emitting element of the embodiment thus configured, heat generated from the LED chip 660 is mostly transmitted to the first lead member 630 and dissipated to the wiring board 670 via the radiation plates 651, 652 and the connection portion 633. Since the radiation plates 651, 652 are disposed near the LED chip 660, heat generated from the LED chip 660 can be dissipated efficiently.

Since the radiation plate is a part of the lead member, the radiation plate may be electrically coupled to the wiring board as an electrode. In this case, the degree of freedom of the pattern of the wiring board can be improved.

The invention is not limited to the aforesaid embodiment and contains various modifications in a range easily thought of by those skilled in the art and not departing from the scope of claims.

What is claimed is:

1. A light-emitting device (LED), comprising:
   a base body portion;
   a first lead member inserted in the base body portion and extending out a first end face of the base portion;
   a second lead member inserted in the base body portion and extending out from a second end face of the base portion opposite the first end face; and
   an LED chip mounted on the first lead member,
   wherein the first lead member is bent to extend down the first end face and then bent to extend along a first portion of a side face of the base body portion, to serve as a first connection of the LED,
   wherein the second lead member is bent to extend down the second end face and then bent to extend along a second portion of the side face of the base body portion, to serve as a second connection of the LED, and
   wherein the first lead member further comprises a plurality of portions extending outward from the side face and bent to extend down the side face to serve as radiation plates of the LED chip.

2. The light-emitting device according to claim 1, further comprising a terminal holding portion placed at a rear portion of a reflection case of the base body portion,
   wherein the portions extending outward from the side face are disposed at a center portion of a side surface of the terminal holding portion between the first lead member and the second lead member.

3. The light-emitting device according to claim 2, wherein the terminal holding portion includes isolation portions between each of the first and the second lead members and the portions extending outward from the side face, and also between portions extending outward from the side face that are disposed on the side surface of the terminal holding portion.

4. The light-emitting device according to claim 1, further comprising a terminal holding portion placed at a rear portion of a reflection case of the base body portion,
   wherein the portions extending outward from the side face extend on a side surface of the terminal holding portion.

5. The light-emitting device according to claim 1, wherein the base body portion comprises a bowl shaped reflection case.

6. The light-emitting device according to claim 1, wherein the base body portion comprises a reflection case, a window being formed with the reflection case.

7. The light-emitting device according to claim 1, wherein an isolation portion is disposed between the second lead member and the portions extending outward from the side face to electrically isolate the second lead member from the portions extending outward from the side face.

8. The light-emitting device according to claim 7, further comprising a terminal holding portion placed at a rear portion of a reflection case of the base body portion,
   wherein said isolation portion extends in a side surface of the terminal holding portion to form a portion of the base body portion.

9. The light-emitting device according to claim 7, further comprising a terminal holding portion placed at a rear portion of a reflection case of the base body portion,
   wherein parts of the lead portions and the portions extending outward from the side face form a same plane as a surface of the terminal holding portion.

10. The light-emitting device according to claim 1, further comprising:
    a terminal holding portion placed at a rear portion of a reflection case of the base body portion; and
    a plurality of isolation portions provided on a side surface of the terminal holding portion and extracted from said side face of the base body portion.

11. The light-emitting device according to claim 10, wherein said isolation portions extend in said side surface of the terminal holding portion to form a portion of the base body portion.

12. The light-emitting device according to claim 1,
    wherein one of said isolation portions is placed between one of the portions extending outward from the side face and the second lead member to electrically isolate the portions extending outward from the side face from the second lead member.

13. The light-emitting device according to claim 12, wherein said portions extending outward from the side face and said isolation portions form said side surface of the terminal holding portion.

14. The light-emitting device according to claim 1, further comprising a terminal holding portion placed at a rear portion of a reflection case of the base body portion,
    wherein portions of the lead members that are extracted from the base body portion extend toward the portions extending outward from the side face in a side surface of the terminal holding portion.

15. The light-emitting device according to claim 1, wherein the portions extending outward from the side face sandwich a portion of the light-emitting device where the LED chip is mounted.

16. The light-emitting device according to claim 1, wherein a portion of each of the portions extending outward from the side face, where an outwardly extracted portion is extracted and bent, is bored to have a smaller width than a width of the base body portion.

17. The light-emitting device according to claim 1, further comprising a terminal holding portion placed at a rear portion of a reflection case of the base body portion,
    wherein notches are formed at the terminal holding portion, and the lead portions and the portions extending outward from the side face respectively enter into respective one of the notches in a rounding manner.

18. The light-emitting device according to claim 1, further comprising a terminal holding portion placed at a rear portion of a reflection case of the base body portion,
    wherein said lead portions connect to a pattern on a wiring board on a side surface of the terminal holding portion at which said lead members extend.

\* \* \* \* \*